US011837578B2

(12) United States Patent
Chen et al.

(10) Patent No.: US 11,837,578 B2
(45) Date of Patent: *Dec. 5, 2023

(54) PACKAGE STRUCTURE

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,854

(22) Filed: Feb. 18, 2022

(65) Prior Publication Data

US 2022/0173070 A1    Jun. 2, 2022

Related U.S. Application Data

(60) Continuation of application No. 16/876,140, filed on May 18, 2020, now Pat. No. 11,257,787, which is a
(Continued)

(51) Int. Cl.
*H01L 27/10* (2006.01)
*H01L 23/02* (2006.01)
(Continued)

(52) U.S. Cl.
CPC ........ *H01L 25/0655* (2013.01); *H01L 21/566* (2013.01); *H01L 23/3128* (2013.01);
(Continued)

(58) Field of Classification Search
CPC ............... H01L 25/0655; H01L 21/566; H01L 23/3128; H01L 23/481; H01L 23/49816;
(Continued)

(56) References Cited

U.S. PATENT DOCUMENTS 9,000,584 B2    4/2015 Lin et al.
9,048,222 B2    6/2015 Hung et al.
(Continued)

*Primary Examiner* — Theresa T Doan
(74) *Attorney, Agent, or Firm* — JCIPRNET

(57) ABSTRACT

A package structure includes at least one semiconductor die, an insulating encapsulant, an isolation layer and a redistribution layer. The at least one first semiconductor die has a semiconductor substrate and a conductive post disposed on the semiconductor substrate. The insulating encapsulant is partially encapsulating the first semiconductor die, wherein the conductive post has a first portion surrounded by the insulating encapsulant and a second portion that protrudes out from the insulating encapsulant. The isolation layer is disposed on the insulating encapsulant and surrounding the second portion of the conductive post. The redistribution layer is disposed on the first semiconductor die and the isolation layer, wherein the redistribution layer is electrically connected to the conductive post of the first semiconductor die.

20 Claims, 22 Drawing Sheets

Related U.S. Application Data division of application No. 16/199,230, filed on Nov. 26, 2018, now Pat. No. 10,658,333.

(60) Provisional application No. 62/712,219, filed on Jul. 31, 2018.

(51) Int. Cl.
*H01L 25/065* (2023.01)
*H01L 21/56* (2006.01)
*H01L 23/498* (2006.01)
*H01L 23/31* (2006.01)
*H01L 23/00* (2006.01)
*H01L 23/48* (2006.01)

(52) U.S. Cl.
CPC ...... *H01L 23/481* (2013.01); *H01L 23/49816* (2013.01); *H01L 24/09* (2013.01); *H01L 24/17* (2013.01); *H01L 24/30* (2013.01); *H01L 24/73* (2013.01); *H01L 2224/0231* (2013.01); *H01L 2224/02373* (2013.01)

(58) Field of Classification Search
CPC ......... H01L 24/09; H01L 24/17; H01L 24/30; H01L 24/73; H01L 2224/0231; H01L 2224/02373; H01L 24/08; H01L 24/16; H01L 2224/04105; H01L 2224/08145; H01L 2224/12105; H01L 2224/16145; H01L 21/486; H01L 2224/73265; H01L 23/5389; H01L 25/0657; H01L 2224/32145; H01L 23/535
USPC ....................................................... 257/211
See application file for complete search history.

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,658,333 B2* | 5/2020 | Chen ................. H01L 23/49816 |
| 2017/0005074 A1* | 1/2017 | Chen ...................... H01L 25/50 |

* cited by examiner

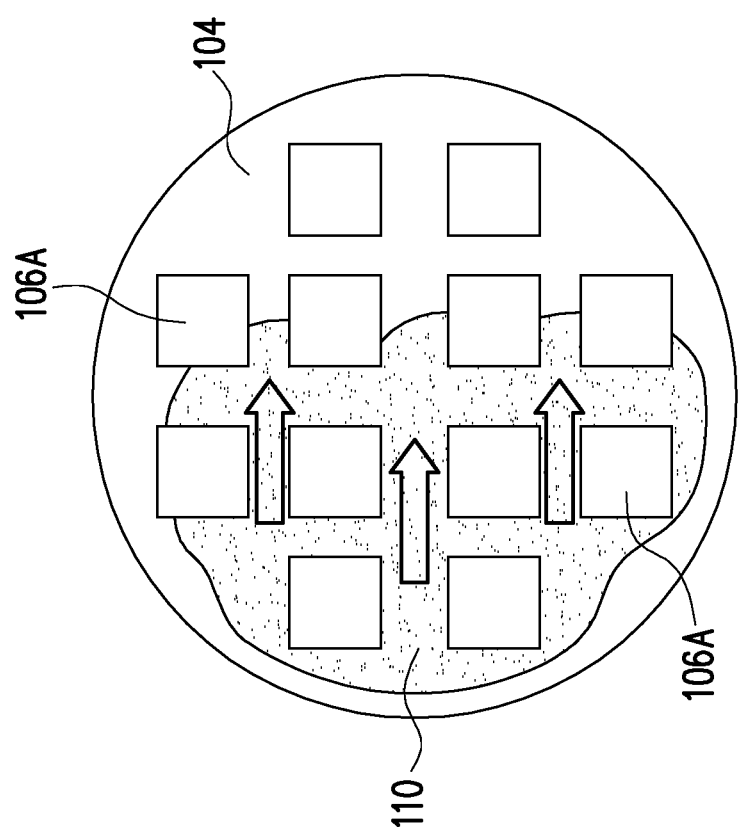

PACKAGE STRUCTURE

CROSS-REFERENCE TO RELATED APPLICATION

This application is a continuation of U.S. application Ser. No. 16/876,140, filed on May 18, 2020, now allowed. The prior application Ser. No. 16/876,140 is a division application and claims the priority benefits of U.S. application Ser. No. 16/199,230, filed on Nov. 26, 2018, which is patented as U.S. Pat. No. 10,658,333 and claims the priority benefits of U.S. provisional application Ser. No. 62/712,219, filed on Jul. 31, 2018. The entirety of each of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
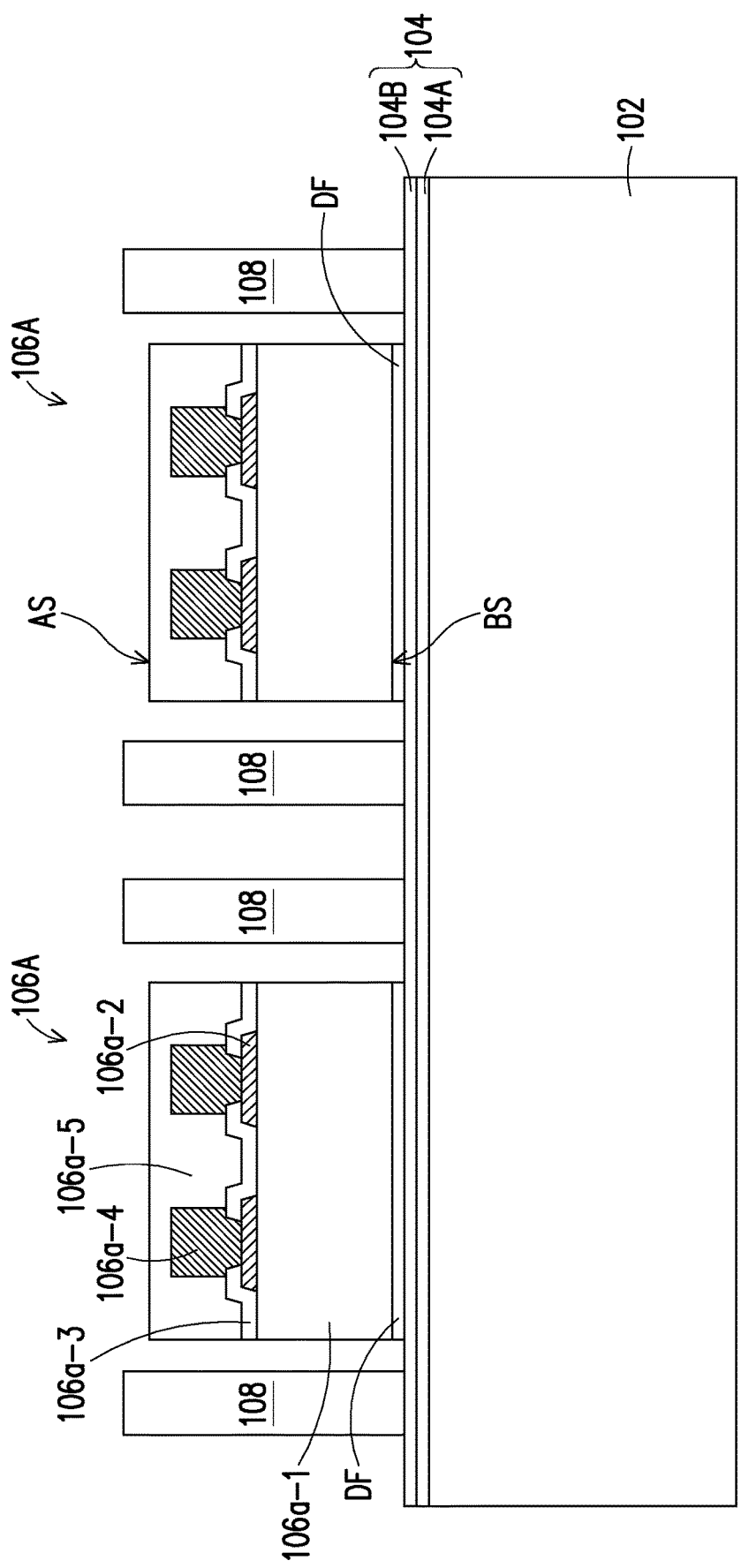
FIG. 1 to FIG. 9 are schematic sectional views of various stages in a method of fabricating a package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 9 are schematic sectional views of various stages in a method of fabricating a package structure according to some exemplary embodiments of the present disclosure. Referring to FIG. 1, a carrier 102 with a buffer layer 104 coated thereon is provided. In one embodiment, the carrier 102 may be a glass carrier or any suitable carrier for carrying a semiconductor wafer or a reconstituted wafer used for the method of fabricating the package structure.

In some embodiments, the buffer layer 104 includes a de-bonding layer 104A and a dielectric layer 104B, wherein the de-bonding layer 104A is located in between the carrier 102 and the dielectric layer 104B. In certain embodiments, the de-bonding layer 104A is disposed on the carrier 102, and the material of the de-bonding layer 104A may be any material suitable for bonding and de-bonding the carrier 102 from the above layer(s) (e.g., the dielectric layer 104B) or any wafer(s) disposed thereon. In some embodiments, the de-bonding layer 104A may include a release layer (such as a light-to-heat conversion ("LTHC") layer) or an adhesive layer (such as an ultra-violet curable adhesive or a heat curable adhesive layer). In some embodiments, the dielectric layer 104B may be formed above the de-bonding layer 104A. The dielectric layer 104B may be made of dielectric materials such as benzocyclobutene ("BCB"), polybenzoxazole ("PBO"), or any other suitable polymer-based dielectric material.

It is noted that the materials of the carrier 102, the de-bonding layer 104A and the dielectric layer 104B are not limited to the descriptions of the embodiments. In some alternative embodiments, the dielectric layer 104B may be optionally omitted; in other words, merely the de-bonding layer 104A is formed over the carrier 102. In certain embodiments, a die-attach film (not shown) may be directly formed on the de-bonding layer 104A for the attachment to above components.

After providing the buffer layer 104, a plurality of through insulator vias 108 is formed on the buffer layer 104 and over the carrier 102, and a plurality of first semiconductor die 106A is provided on the buffer layer 104. In some embodiments, the through insulator vias 108 are through integrated fan-out ("InFO") vias. In one embodiment, the formation of the through insulator vias 108 includes forming a mask pattern (not shown) with openings, then forming a metallic material (not shown) filling up the openings by electroplating or deposition, and removing the mask pattern to form the through insulator vias 108 on the buffer layer 104. The material of the mask pattern may include a positive photo-resist or a negative photo-resist. In one embodiment, the material of the through insulator vias 108 may include a metal material such as copper or copper alloys, or the like. However, the disclosure is not limited thereto.

In an alternative embodiment, the through insulator vias 108 may be formed by forming a seed layer (not shown) on the buffer layer 104; forming the mask pattern with openings exposing portions of the seed layer; forming the metallic material on the exposed portions of the seed layer to form the through insulator vias 108 by plating; removing the mask pattern; and then removing portions of the seed layer exposed by the through insulator vias 108. For example, the seed layer may be a titanium/copper composited layer. For simplification, only four through insulator vias 108 are illustrated in FIG. 1. However, it should be noted that the number of through insulator vias 108 is not limited thereto, and can be selected based on requirement.

As illustrated in FIG. 1, one or more first semiconductor dies 106A may be picked and placed on the buffer layer 104. In certain embodiments, the first semiconductor die 106A has an active surface AS, and a backside surface BS opposite to the active surface AS. For example, the backside surface BS of the first semiconductor die 106A may be attached to the buffer layer 104 through a die attach film DF. By using the die attach film DF, a better adhesion between the first semiconductor dies 106A and the buffer layer 104 is ensured. In the exemplary embodiment, only two first semiconductor dies 106A are illustrated. However, the disclosure is not limited thereto. It should be noted that the number of first semiconductor dies 106A disposed on the buffer layer 104 may be adjusted based on product requirement.

In the exemplary embodiment, each of the first semiconductor die 106A includes a semiconductor substrate 106a-1, a plurality of conductive pads 106a-2, a passivation layer 106a-3, a plurality of conductive posts 106a-4, and a protection layer 106a-5. As illustrated in FIG. 1, the plurality of conductive pads 106a-2 is disposed on the semiconductor substrate 106a-1. The passivation layer 106a-3 is formed over the semiconductor substrate 106a-1 and has openings that partially expose the conductive pads 106a-2 on the semiconductor substrate 106a-1. The semiconductor substrate 106a-1 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106a-2 may be aluminum pads, copper pads or other suitable metal pads. The passivation layer 106a-3 may be a silicon oxide layer, a silicon nitride layer, a silicon oxy-nitride layer or a dielectric layer formed of any suitable dielectric materials.

Furthermore, in some embodiments, a post-passivation layer (not shown) is optionally formed over the passivation layer 106a-3. The post-passivation layer covers the passivation layer 106a-3 and has a plurality of contact openings. The conductive pads 106a-2 are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 106a-4 are formed on the conductive pads 106a-2 by plating. In some embodiments, the protection layer 106a-5 is formed on the passivation layer 106a-3 or on the post passivation layer, and covering the conductive posts 106a-4 so as to protect the conductive posts 106a-4.

In some embodiments, when more than one first semiconductor dies 106A are placed on the buffer layer 104, the first semiconductor dies 106A may be arranged in an array, and when the first semiconductor dies 106A are arranged in an array, the through insulator vias 108 may be classified into groups. The number of the first semiconductor dies 106A may correspond to the number of the groups of the through insulator vias 108. In the illustrated embodiment, the first semiconductor dies 106A may be picked and placed on the buffer layer 104 after the formation of the through insulator vias 108. However, the disclosure is not limited thereto. In some alternative embodiments, the first semiconductor dies 106A may be picked and placed on the buffer layer 104 before the formation of the through insulator vias 108.

In some embodiments, the first semiconductor dies 106A may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 2A:
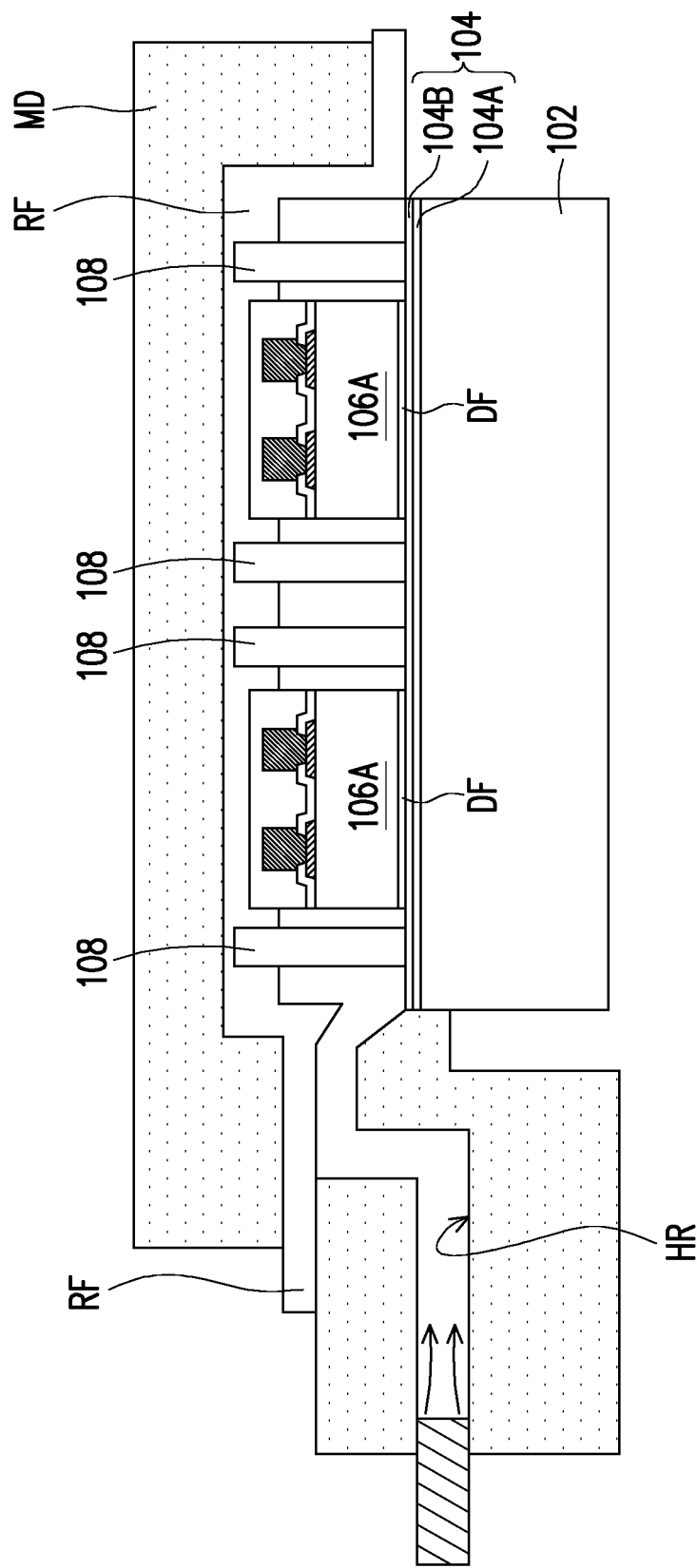
Figure 2B:
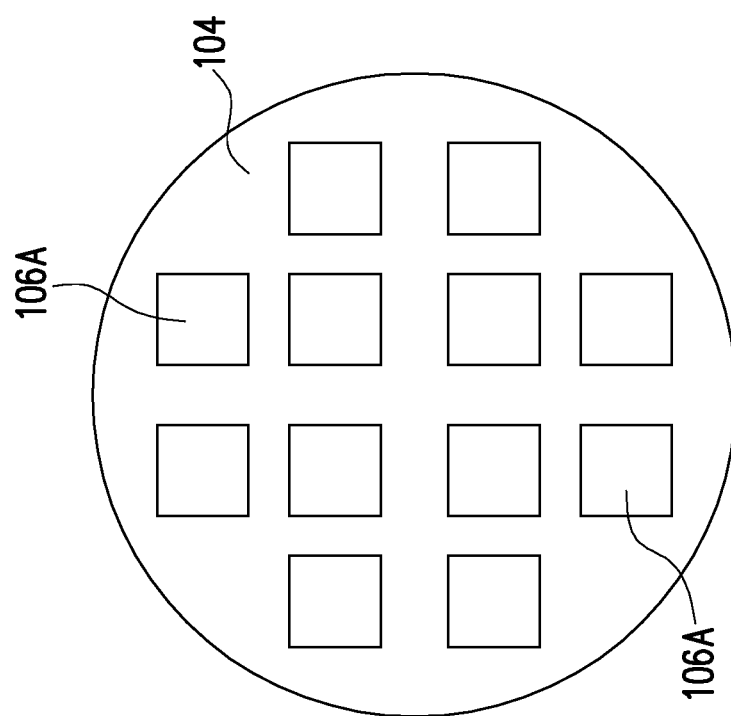

Referring to FIG. 2A, in a next step, a mold MD is provided on the carrier 102 covering the first semiconductor dies 106A and the plurality of through insulator vias 108. In some embodiments, the mold MD may comprise runner holes HR and a release film RF attached to an inner surface of the mold MD. The runner holes HR are located on one side of the mold MD. In some embodiments, the release film RF is pressed onto the first semiconductor dies 106A so as to partially cover the first semiconductor dies 106A. In certain embodiments, the release film RF is further pressed onto the through insulator vias 108 so as to partially cover the through insulator vias 108. FIG. 2B is a top view of the structure shown in FIG. 2A, wherein the mold MD, the release film RF and the through insulator vias 108 are omitted for illustrative purposes. As shown in FIG. 2B, the first semiconductor dies 106A are located on the buffer layer 104, and a top surface of the buffer layer 104 is exposed prior to forming the insulating encapsulant.

Figure 3A:
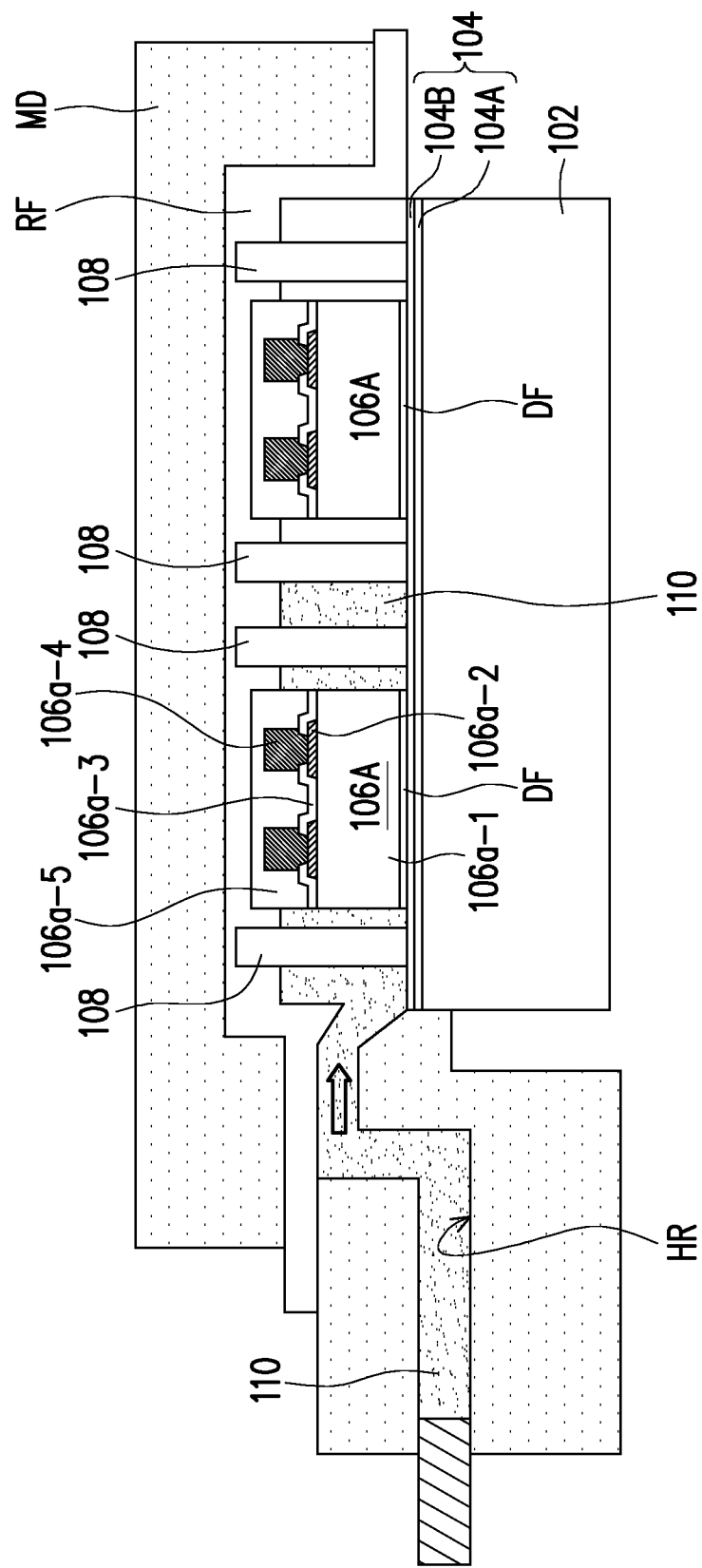

Referring to FIG. 3A, an insulating material 110 is injected through the runner holes RH into the mold MD so that the insulating material 110 partially encapsulates the first semiconductor dies 106A and the through insulator vias 108. FIG. 3B is a top view of the structure shown in FIG. 3A, wherein the mold MD, the release film RF and the through insulator vias 108 are omitted for illustrative purposes. As shown in FIG. 3B, the insulating material 110 is injected from one side of the mold MD and is spread onto the buffer layer 104 so as to cover the buffer layer 104. In some embodiments, the insulating material 110 spreads and surrounds each of the first semiconductor dies 106A. In certain embodiments, the insulating material 110 fill up the gaps in between the first semiconductor dies 106A and adjacent through insulator vias 108. Due to the presence of the release film RF, portions of the first semiconductor dies 106A and portions of the through insulator vias 108 are not covered by the insulating material 110. By injecting the insulating material 110 from one side of the mold MD, the insulating encapsulant formed in subsequent steps can have a predetermined height. In other words, the insulating encapsulant can be formed without the need of further grinding or planarization steps. Therefore, the generation of molding pits due to the presence of fillers in the insulating encapsulant after the grinding or planarization steps may be reduced.

In some embodiments, the insulating material 110 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 110 may include an acceptable insulating encapsulation material. The insulating material 110 may be injected as liquid, or in other forms that have a slower flow rate than liquid. In some embodiments, the insulating material 110 may further include inorganic filler or inorganic compound (e.g. silica, clay, and so on) which can be added therein to optimize coefficient of thermal expansion (CTE) of the insulating material 110. In certain embodiments, the inorganic fillers may be dielectric particles of $SiO_2$, $Al_2O_3$, silica, or the like, and may have spherical shapes. In some embodiments, fine fillers or large fillers may be used as the filler particles based on requirement.

Figure 4A:
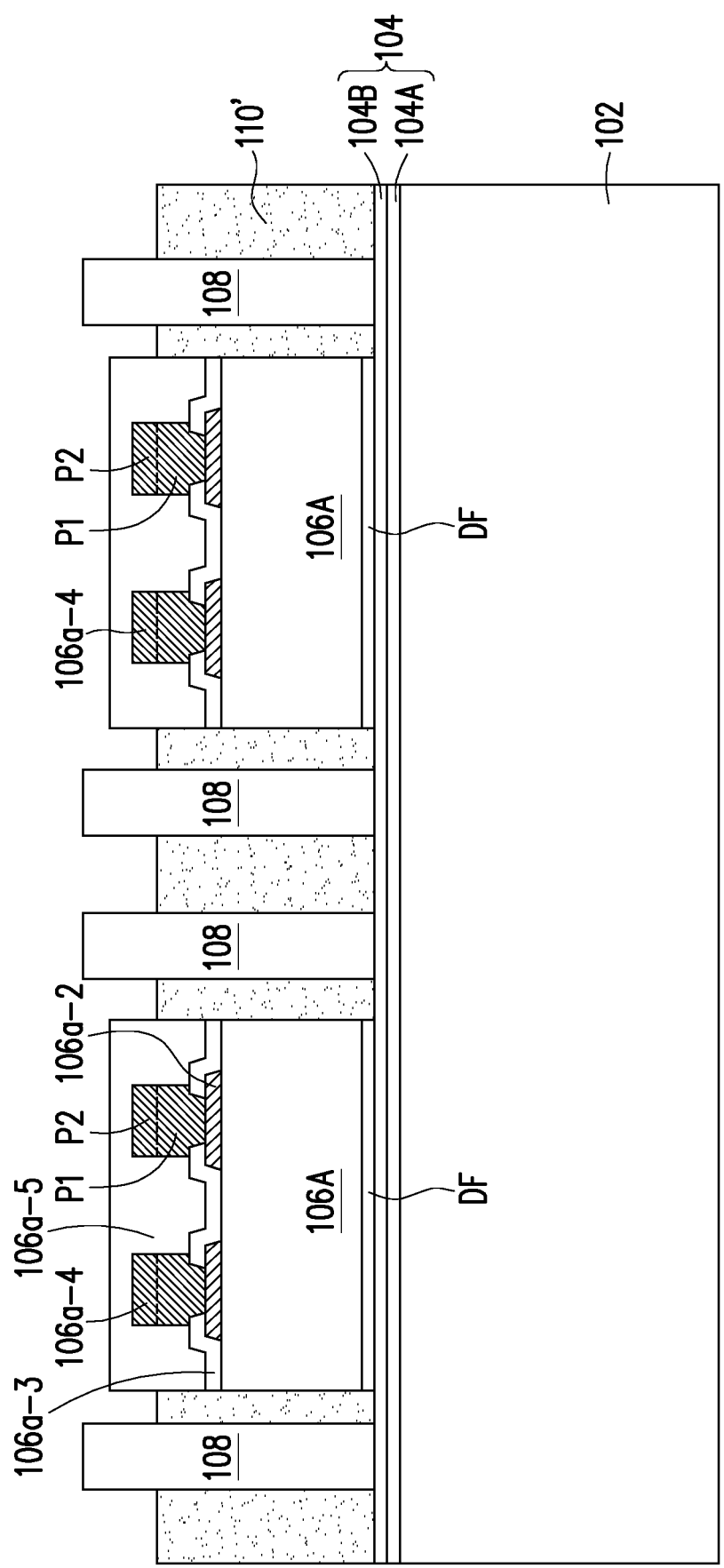
Figure 4B:
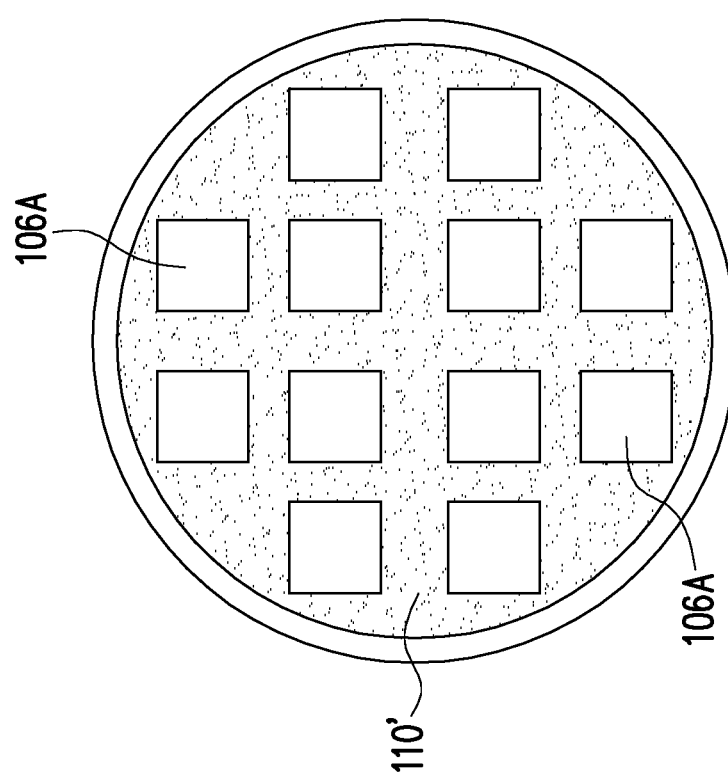

Referring to FIG. 4A, after injecting the insulating material 110, the insulating material 110 is cured to form the insulating encapsulant 110'. The mold MD may then be removed, and the release film RF is peeled off to reveal portions of the first semiconductor dies 106A and portions of the through insulator vias 108. FIG. 4B is a top view of the structure shown in FIG. 4A, wherein the through insulator vias 108 are omitted for illustrative purposes. As shown in FIG. 4B, the insulating encapsulant 110' is formed to surround each of the first semiconductor dies 106A while revealing top surfaces of the first semiconductor dies 106A. Furthermore, as illustrated in FIG. 4A and FIG. 4B, the first semiconductor dies 106A and the through insulator vias 108 protrudes out from the insulating encapsulant 110'. In certain embodiments, a first portion P1 of the conductive posts 106*a*-4 is surrounded by the insulating encapsulant 110', whereas a second portion P2 of the conductive posts 106*a*-4 protrudes out from the insulating encapsulant 110'. In some embodiments, portions of the protection layer 106*a*-5 also protrudes out from the insulating encapsulant 110'.

Figure 5:
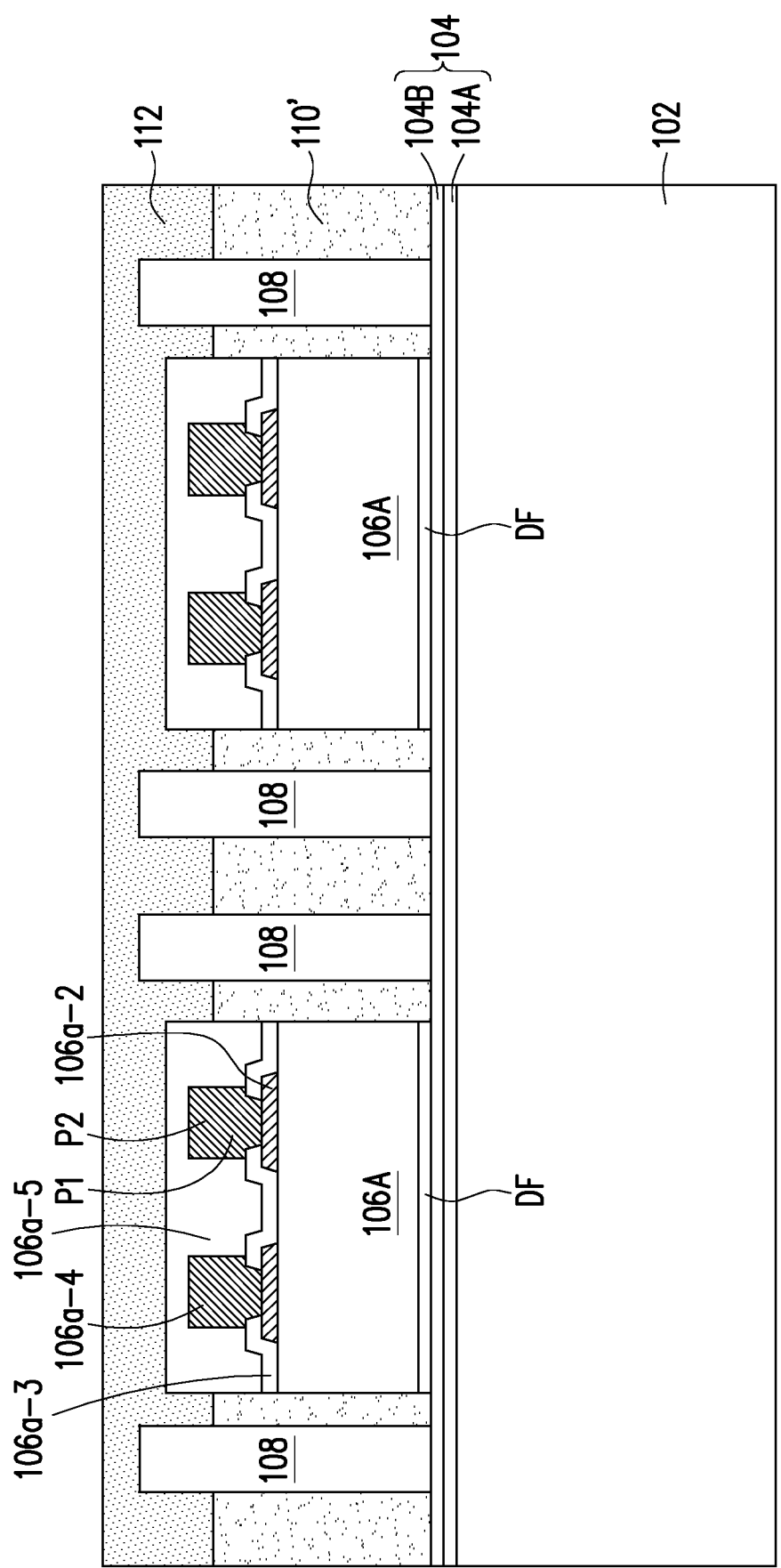

Referring to FIG. 5, in a next step, an isolation material 112 is formed on the insulating encapsulant 110' to cover the protruded portions (or exposed portions) of the first semiconductor dies 106A and the through insulator vias 108. In some embodiments, the isolation material 112 is formed by suitable fabrication techniques such as chemical vapor deposition (CVD), plasma-enhanced chemical vapor deposition (PECVD) or the like. The disclosure is not limited thereto. At this stage, the first semiconductor dies 106A and the through insulator vias 108 are well protected and covered by the isolation material 112. In some embodiments, the isolation material 112 may include dielectric materials such as polyimide, polybenzoxazole (PBO), benzocyclobutene (BCB) or the like. The disclosure is not limited thereto. In certain embodiments, the isolation material 112 may be made of different materials as compared with the insulating encapsulant 110'. In some other embodiments, the isolation material 112 may include materials similar to those listed for the insulating encapsulant 110', but do not contain any filler particles therein. Since the isolation material 112 and the insulating encapsulant 110' are formed in different steps, when forming the isolation material 112 over the insulating encapsulant 110', an interface will exist in between the isolation material 112 and the insulating encapsulant 110'.

Figure 6:
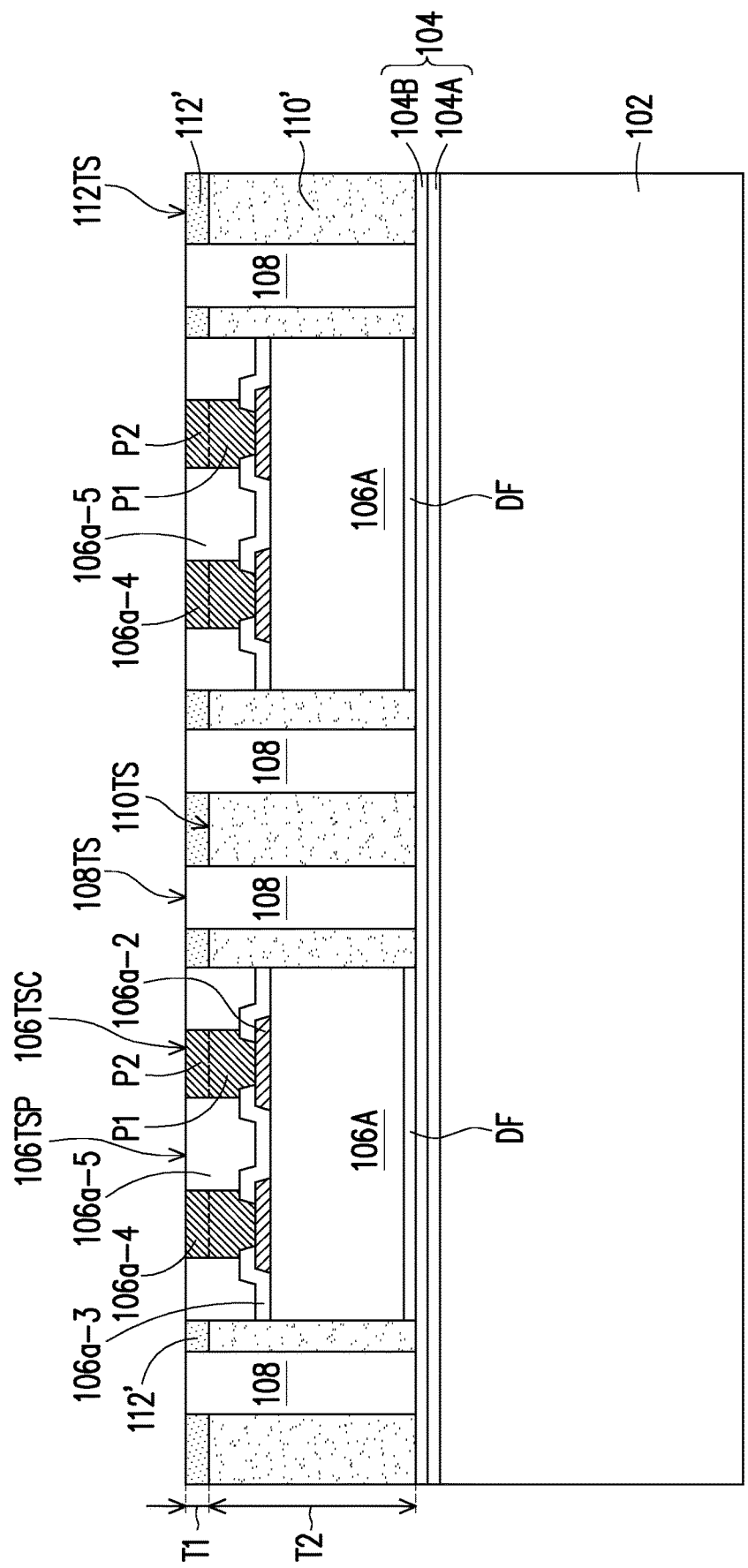

Referring to FIG. 6, after forming the isolation material 112, the isolation material 112 is partially removed to expose the conductive posts 106*a*-4 and the through insulator vias 108. In some embodiments, the isolation material 112 and the protection layer 106*a*-5 are ground or polished by a planarization step. For example, the planarization step is performed through a mechanical grinding process and/or a chemical mechanical polishing (CMP) process until the top surfaces 106TSC of the conductive posts 106*a*-4 are revealed. In some embodiments, the through insulator vias 108 may be partially polished so that the top surfaces 108TS of the through insulator vias 108 are leveled with the top surfaces 106TSC of the conductive posts 106*a*-4. In other words, the conductive posts 106*a*-4 and the through insulator vias 108 may also be slightly grinded/polished. In some embodiments, a top surface 110TS of the insulating encapsulant 110' is lower than a level of the top surface 106TSC of the plurality of conductive posts 106*a*-4.

In the illustrated embodiment, the isolation material 112 is polished to form an isolation layer 112'. In some embodiments, a top surface 112TS of the isolation layer 112', the top surface 108TS of the through insulator vias 108, the top surface 106TSC of the conductive posts 106*a*-4, and a top surface 106TSP of the polished protection layer 106*a*-5 are coplanar and leveled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

In addition, as illustrated in FIG. 6, the isolation layer 112' is formed on the insulating encapsulant 110' and surrounds the second portion P2 of the conductive posts 106*a*-4, and further surrounds the protection layer 106*a*-5. In some embodiments, the isolation layer 112' and the conductive posts 106*a*-4 are separated from one another by having the protection layer 106*a*-5 located therebetween. In other words, the isolation layer 112' is not in physical contact with the conductive posts 106*a*-4. Furthermore, a ratio of a thickness T1 of the isolation layer 112' to a thickness T2 of the insulating encapsulant 110' is in a range of 1:6 to 1:40. By controlling the thickness T1 of the isolation layer 112' and the thickness T2 of the insulating encapsulant 110' in such a range, protection of the first semiconductor dies 106A can be ensured, while the molding pits (if any) on the insulating encapsulant 110' can be effectively covered or isolated by the isolation layer 112'. If the thickness T1 of the isolation layer 112' is too small, the molding pits on the insulating encapsulant 110' might not be well covered and isolated, and a redistribution layer (RDL) collapse issue may still exist. In some embodiments, the thickness T1 of the isolation layer 112' is in a range from 1 μm to 30 μm. In certain embodiments, the thickness T1 if the isolation layer 112' is in a range from 5 μm to 20 μm. In one exemplary embodiment, the thickness T1 of the isolation layer 112' is about 5 μm.

Figure 7:
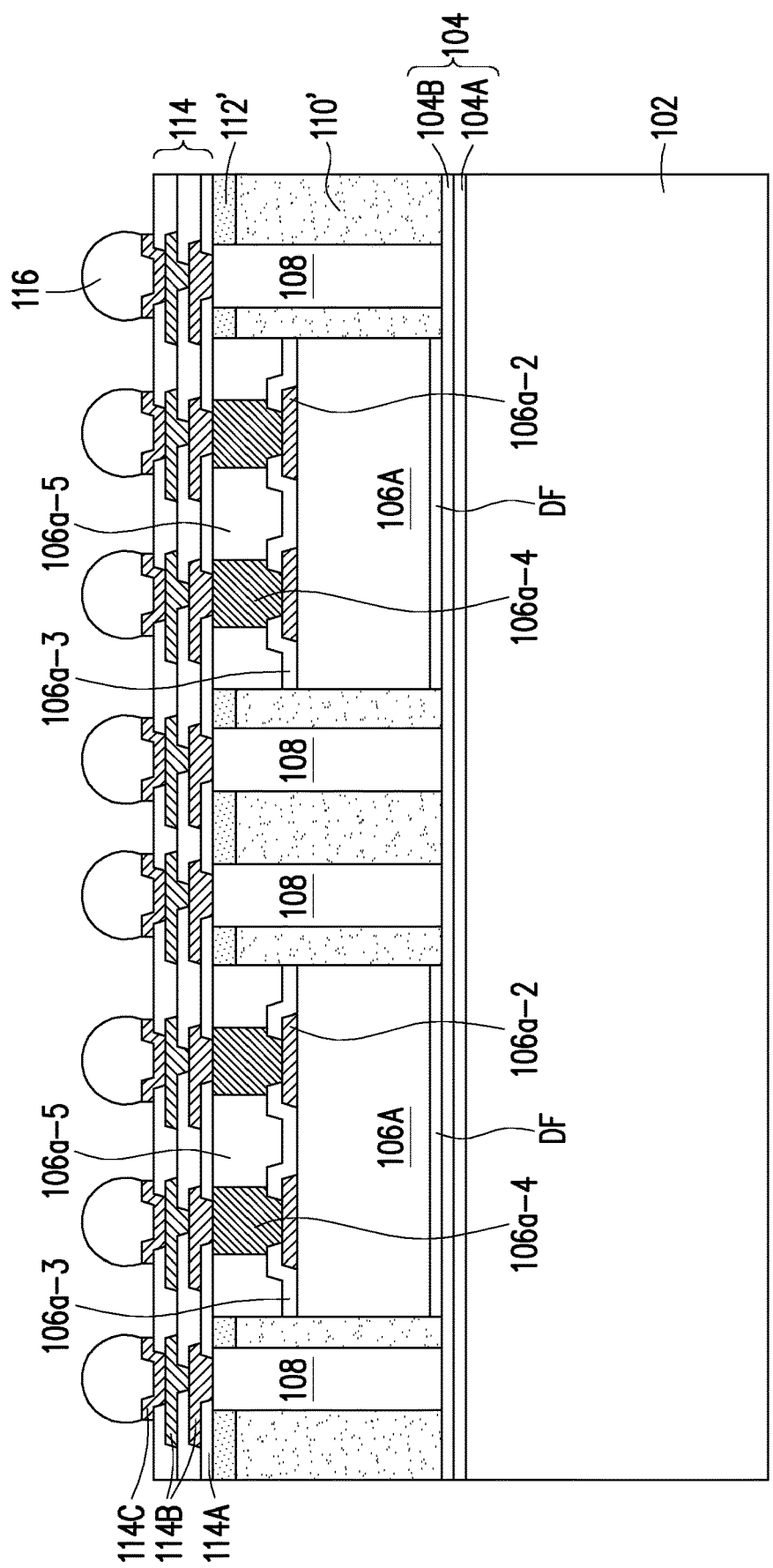

Referring to FIG. 7, after the planarization step, a redistribution layer 114 is formed on the isolation layer 112', the through insulator vias 108 and on the first semiconductor dies 106A. As illustrated in FIG. 7, the redistribution layer 114 is formed on the top surface 108TS of the through insulator vias 108, on the top surface 106TSP of the conductive posts 106a-4, and on the top surface 112TS of the isolation layer 112'. In some embodiments, the isolation layer 112' separates the redistribution layer 114 from the insulating encapsulant 110'. In some embodiments, the redistribution layer 114 is electrically connected to the through insulator vias 108, and is electrically connected to the first semiconductor dies 106A through the conductive posts 106a-4. In certain embodiments, the first semiconductor die 106A is electrically connected to the through insulator vias 108 through the redistribution layer 114.

In some embodiments, the formation of the redistribution layer 114 includes sequentially forming one or more dielectric layers 114A, and one or more metallization layers 114B in alternation. In certain embodiments, the metallization layers 114B are sandwiched between the dielectric layers 114A. Although only two layers of the metallization layers 114B and three layers of dielectric layers 114A are illustrated herein, however, the scope of the disclose is not limited by the embodiments of the disclosure. In other embodiments, the number of metallization layers 114B and the dielectric layers 114A may be adjusted based on product requirement. In some embodiments, the metallization layers 114B are electrically connected to the conductive posts 106a-4 of the first semiconductor dies 106A. Furthermore, the metallization layers 114B are electrically connected to the through insulator vias 108.

In certain embodiments, the material of the dielectric layers 114A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 114A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 114B may be made of conductive materials formed by electroplating or deposition, such as aluminum, titanium, copper, nickel, tungsten, and/or alloys thereof, which may be patterned using a photolithography and etching process. In some embodiments, the metallization layer 114B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 114, a plurality of conductive pads 114C may be disposed on an exposed top surface of the topmost layer of the metallization layers 114B for electrically connecting with conductive balls. In certain embodiments, the conductive pads 114C are for example, under-ball metallurgy (UBM) patterns used for ball mount. As shown in FIG. 7, the conductive pads 114C are formed on and electrically connected to the redistribution layer 114. In some embodiments, the materials of the conductive pads 114C may include copper, nickel, titanium, tungsten, or alloys thereof or the like, and may be formed by an electroplating process, for example. The number of conductive pads 114C are not limited in this disclosure, and may be selected based on the design layout. In some alternative embodiments, the conductive pads 114C may be omitted. In other words, conductive balls 116 formed in subsequent steps may be directly disposed on the redistribution layer 114.

Referring still to FIG. 7, after forming the conductive pads 114C, a plurality of conductive balls 116 is disposed on the conductive pads 114C and over the redistribution layer 114. In some embodiments, the conductive balls 116 may be disposed on the conductive pads 114C by a ball placement process or reflow process. In some embodiments, the conductive balls 116 are, for example, solder balls or ball grid array (BGA) balls. In some embodiments, the conductive balls 116 are connected to the redistribution layer 114 through the conductive pads 114C. In certain embodiments, some of the conductive balls 116 may be electrically connected to the first semiconductor dies 106A through the redistribution layer 114. Furthermore, some of the conductive balls 116 may be electrically connected to the through insulator vias 108 through the redistribution layer 114. The number of the conductive balls 116 is not limited to the disclosure, and may be designated and selected based on the number of the conductive pads 114C. In some alternative embodiments, an integrated passive device (IPD) (not shown) may optionally be disposed on the redistribution layer 114 and electrically connected to the redistribution layer 114.

Figure 8:
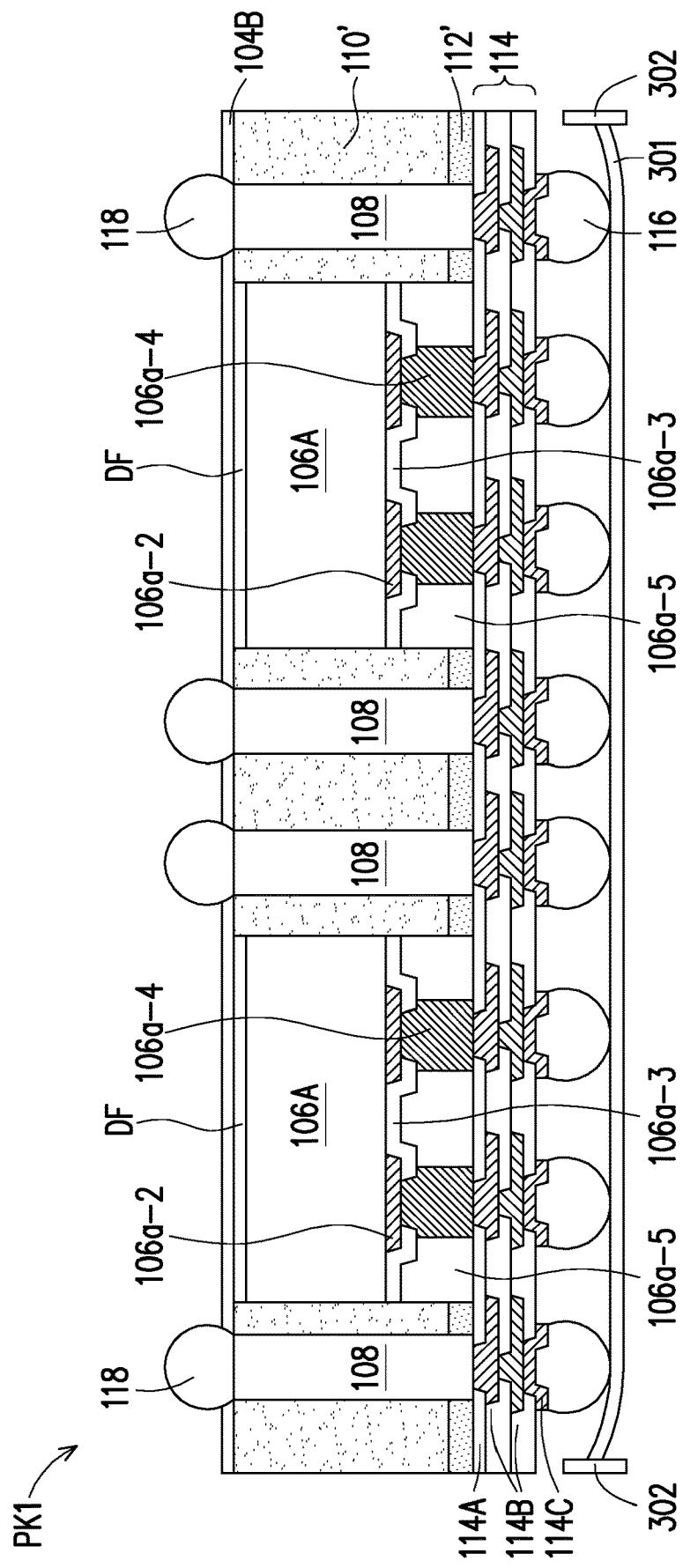

Referring to FIG. 8, in a next step, after forming the redistribution layer 114 and the conductive balls 116, the structure shown in FIG. 7 may be turned upside down and attached to a tape 301 supported by a frame 302. Subsequently, the carrier 102 is debonded so as to separate the dielectric layer 104B and the other elements formed thereon from the carrier 102. In the exemplary embodiment, the de-bonding process includes projecting a light such as a laser light or an UV light on the de-bonding layer 104A (e.g., the LTHC release layer), such that the carrier 102 can be easily removed. In certain embodiments, the de-bonding layer 104A may be further removed or peeled off to reveal the dielectric layer 104B. The remaining dielectric layer 104B may then be patterned to form a plurality of openings (not shown) that expose the bottom surfaces of the through insulator vias 108. The number of openings formed is corresponding to the number of the through insulator vias 108. Thereafter, a plurality of conductive balls 118 may be placed on the bottom surface of the through insulator vias 108 exposed by the openings. The conductive balls 118 are, for example, reflowed to bond with the bottom surfaces of the through insulator vias 108. After the conductive balls 118 are formed, a package structure PK1 having dual-side terminals is accomplished.

Figure 9:
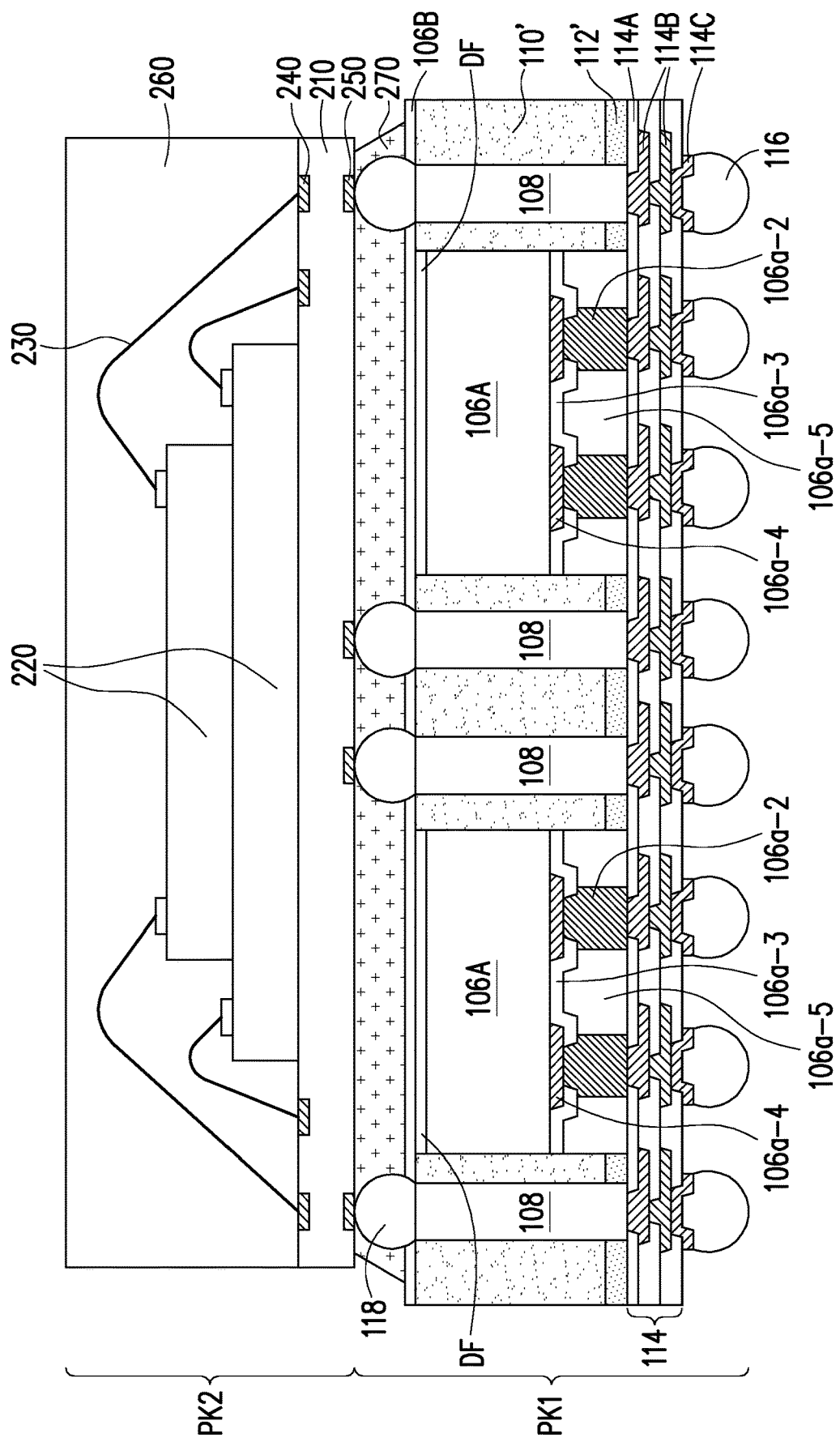

Referring to FIG. 9, in some embodiments, another package structure PK2 may be stacked on the package structure PK1 so as to form a package-on-package (PoP) structure. As illustrated in FIG. 9, the package structure PK2 is electrically connected to the conductive balls 118 of the package structure PK1. In some embodiments, the package structure PK2 has a substrate 210, a plurality of semiconductor chips 220 mounted on one surface (e.g. top surface) of the substrate 210 and stacked on top of one another. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the package structure PK2 are electrically connected to the conductive balls 118 of the package structure PK1. In some embodiments, an underfill 270 is further provided to fill in the spaces between the conductive balls 118 to protect the conductive balls 118. After stacking the package structure PK2 on the package structure PK1 and providing electrical connection therebetween, a package-on-package structure 10A can be fabricated.

Figure 10A:
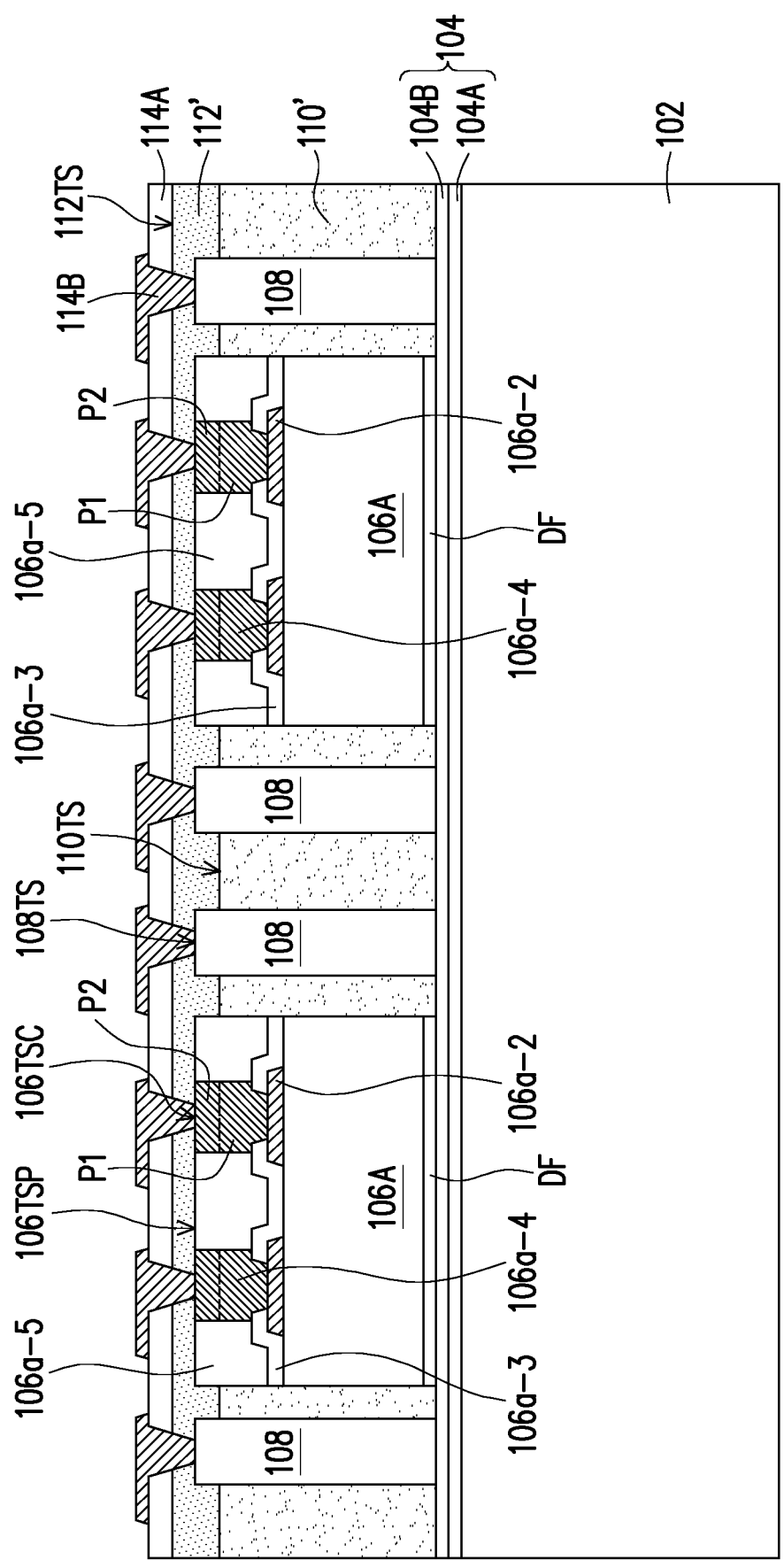
FIG. 10A and FIG. 10B are schematic sectional views of various stages in a method of fabricating a package structure according to some other exemplary embodiments of the present disclosure.
Figure 10B:
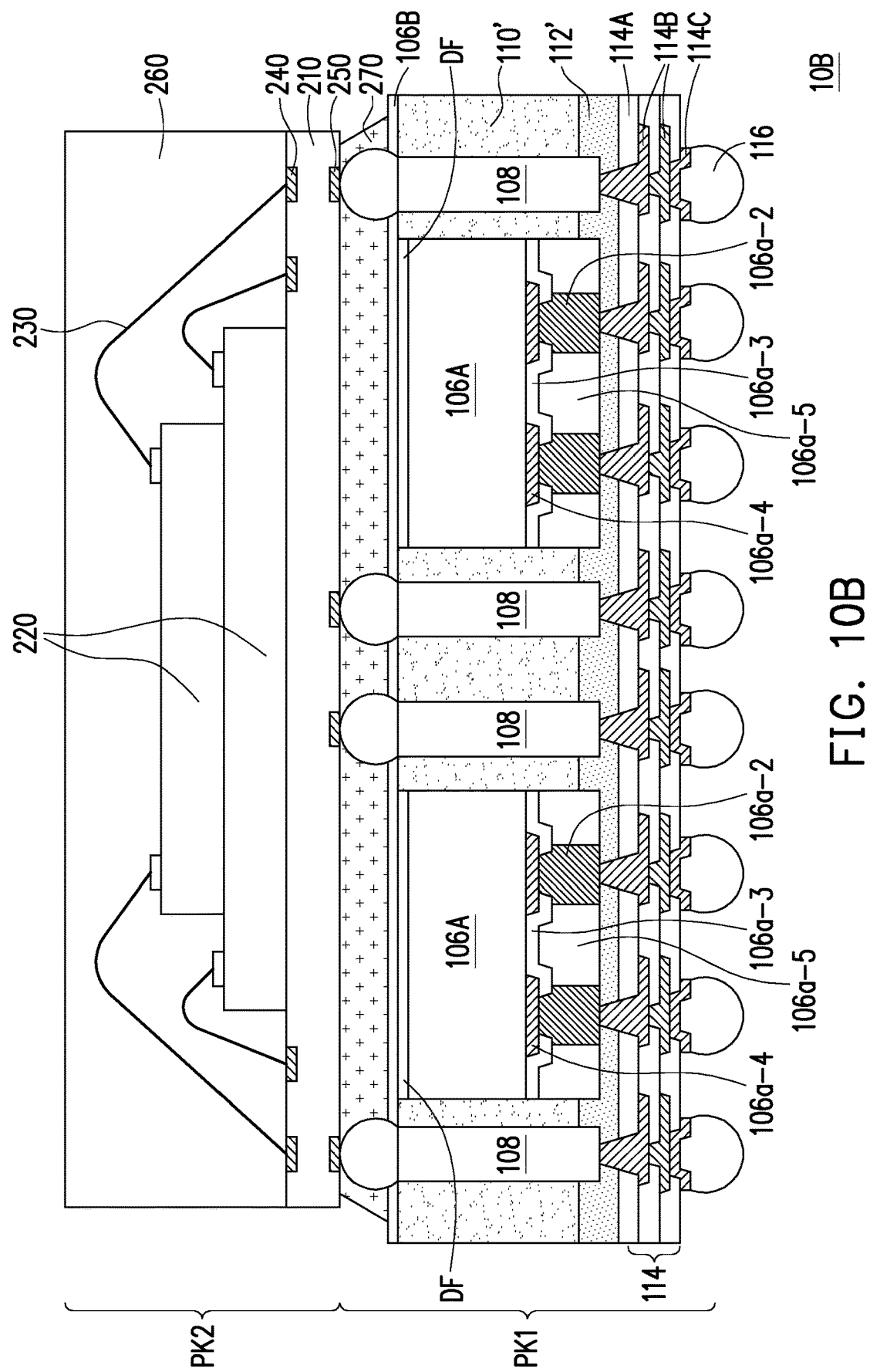

FIG. 10A and FIG. 10B are schematic sectional views of various stages in a method of fabricating a package structure according to some other exemplary embodiments of the present disclosure. The embodiment shown in FIG. 10A and FIG. 10B is similar to the embodiment shown in FIG. 1 to FIG. 9, hence the same reference numerals are used to refer to the same or liked parts, and its detailed description will be omitted herein. The difference between the embodiments of FIGS. 10A-10B and FIGS. 1-9 is in the design of the isolation layer 112'. As illustrated in FIG. 10A, the isolation layer 112' is formed to surround the second portion P2 of the conductive posts 106*a*-4. Furthermore, in some embodiments, a top surface 106TSP of the protection layer 106*a*-5 is lower than a top surface 112TS of the isolation layer 112'. In other words, a planarization step is not performed to the isolation layer 112', and the isolation layer 112' will surround and be located on the top surface 108TS of the through insulator vias 108, and located on the top surface 106TSP of the protection layer 106*a*-5. In a subsequent step, a first dielectric layer 114A of the redistribution layer 114 is formed over the isolation layer 112'. The first dielectric layer 114A and the isolation layer 112' are patterned to form openings that reveal the top surface 108TS of the through insulator vias 108 and the top surface 106TSC of the conductive posts 106*a*-4. The metallization layers 114B are then formed within the openings to be electrically connected to the first semiconductor dies 106A and the through insulator vias 108.

Referring to FIG. 10B, in some embodiments, the same steps described in FIG. 7 to FIG. 9 may then be performed to form the redistribution layer 114, the conductive balls 116 and 118 of the package structure PK1. Subsequently, the same package structure PK2 may be stacked over the package structure PK1 and be electrically connected thereto. After stacking the package structure PK2 on the package structure PK1 and providing electrical connection therebetween, a package-on-package structure 10B can be fabricated.

Figure 11A:
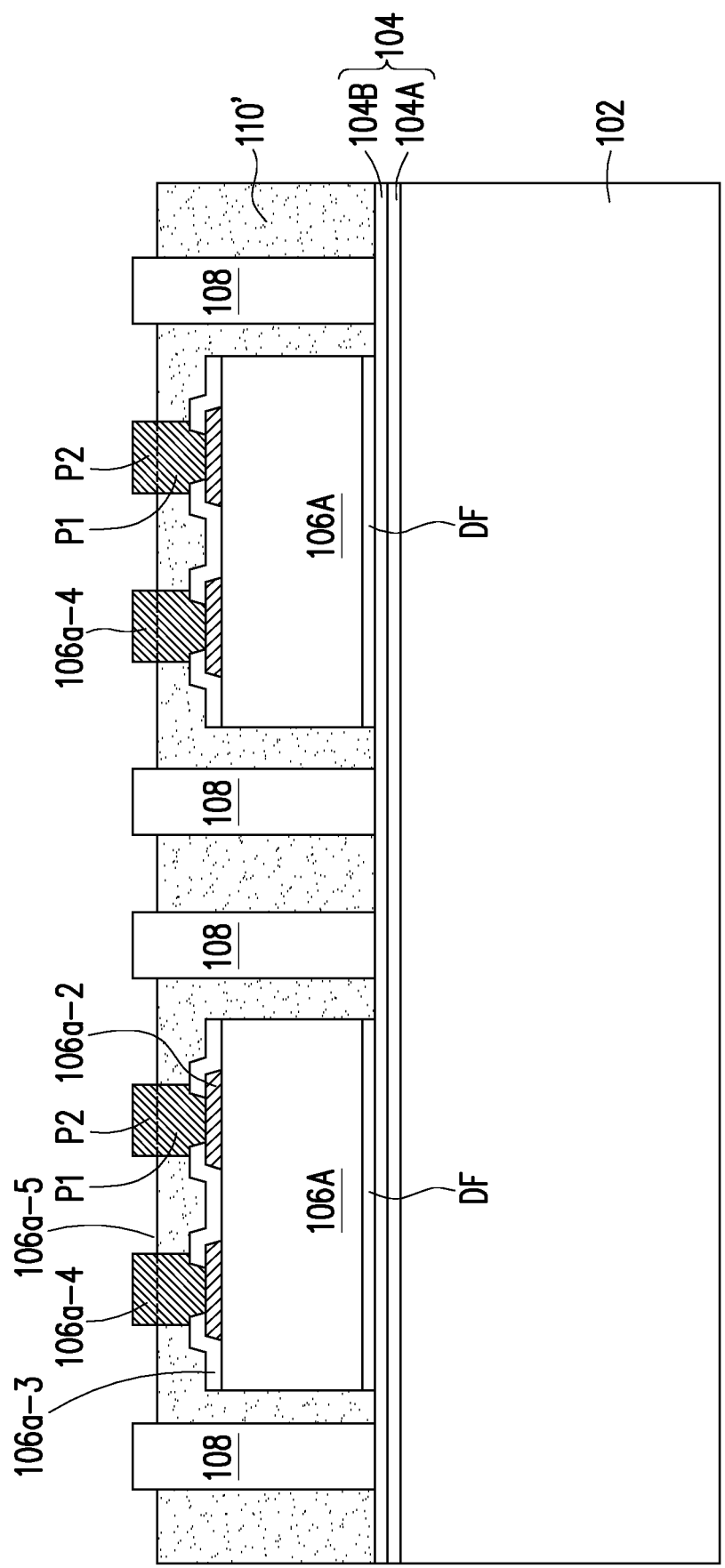
FIG. 11A to FIG. 11C are schematic sectional views of various stages in a method of fabricating a package structure according to some other exemplary embodiments of the present disclosure.
Figure 11B:
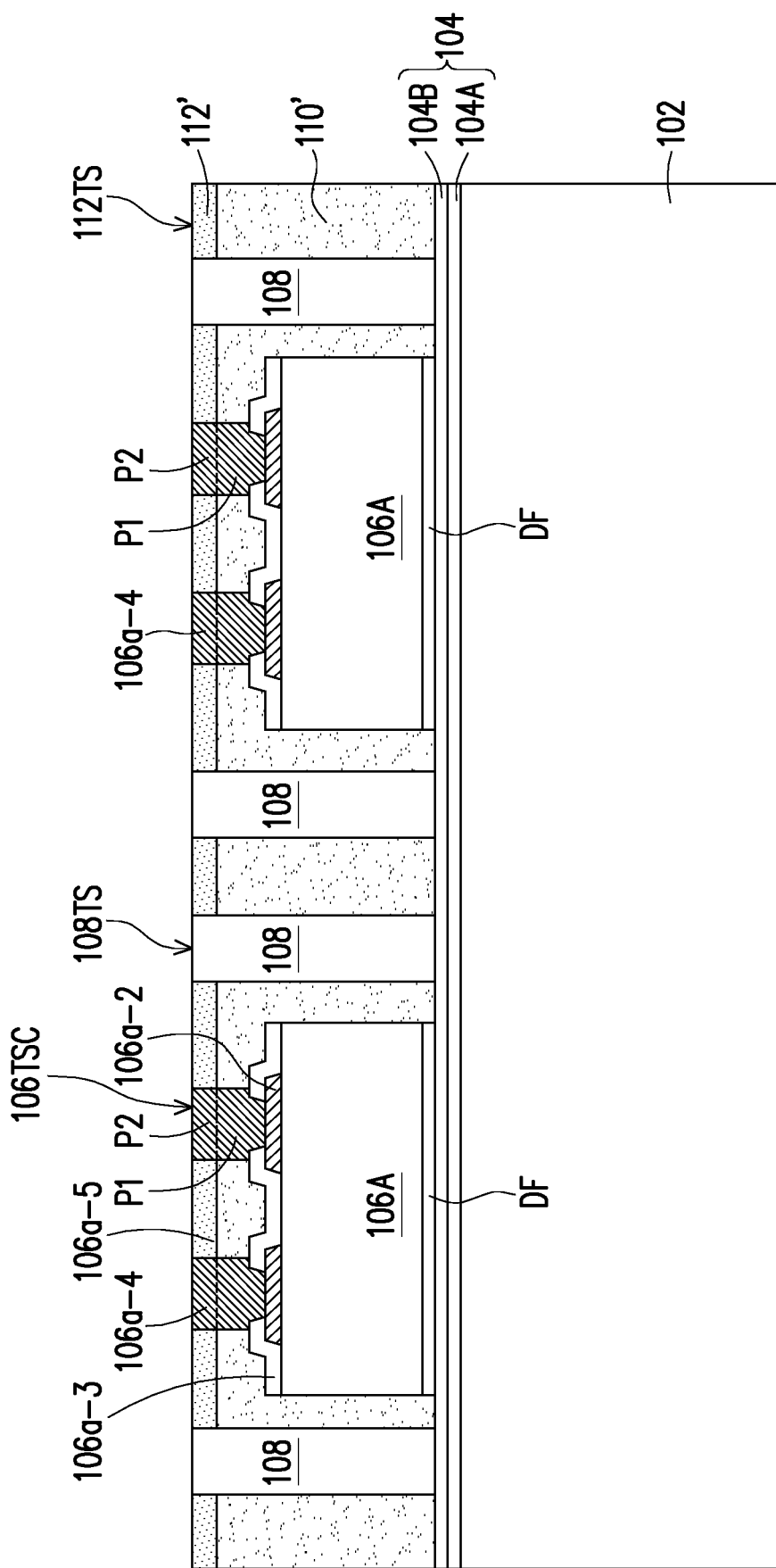
Figure 11C:
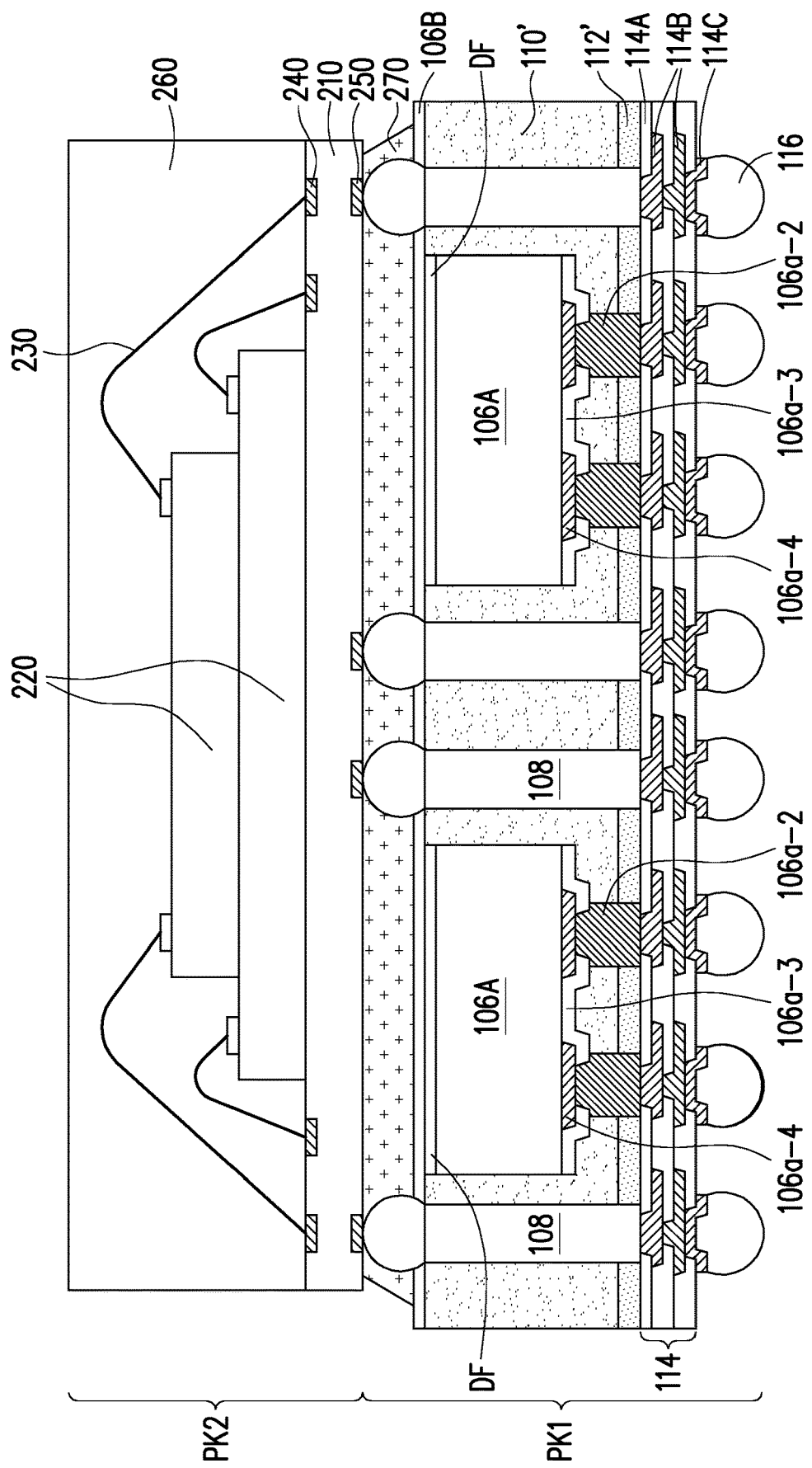

FIG. 11A to FIG. 11C are schematic sectional views of various stages in a method of fabricating a package structure according to some other exemplary embodiments of the present disclosure. The embodiment shown in FIG. 11A to FIG. 11C is similar to the embodiment shown in FIG. 1 to FIG. 9, hence the same reference numerals are used to refer to the same or liked parts, and its detailed description will be omitted herein. The difference between the embodiments of FIGS. 11A-11C and FIGS. 1-9 is in the design of the first semiconductor die 106A.

As illustrated in FIG. 11A, in some embodiments, the protection layer 106*a*-5 may be omitted from the first semiconductor die 106A. As such, during the formation of the insulating encapsulant 110', the insulating encapsulant 110' will come in contact with the conductive posts 106*a*-4 of the first semiconductor dies 106A. In certain embodiments, the insulating encapsulant 110' comes in contact with the first portion P1 of the conductive posts 106*a*-4, while the second portion P2 of the conductive posts 106*a*-4 is revealed from the insulating encapsulant 110'. Referring to FIG. 11B, in a next step, an isolation material (not shown) may be formed over the insulating encapsulant 110', and a planarization step may be performed to form the isolation layer 112'. In the exemplary embodiment, after the planarization step, the top surface 112TS of the isolation layer 112', the top surface 108TS of the through insulator vias 108 and the top surface 106TSC of the conductive posts 106*a*-4 are coplanar and leveled with one another. Furthermore, in some embodiments, the isolation layer 112' surrounds and is in contact with the plurality of conductive posts 106*a*-4. In certain embodiments, the isolation layer 112' comes in contact with the second portion P2 of the conductive posts 106*a*-4. Referring to FIG. 11C, after forming the isolation layer 112', the same steps described in FIG. 7 to FIG. 9 may then be performed to form the redistribution layer 114, the conductive balls 116 and 118 of the package structure PK1. Subsequently, the same package structure PK2 may be stacked over the package structure PK1 and be electrically connected thereto. After stacking the package structure PK2 on the package structure PK1 and providing electrical connection therebetween, a package-on-package structure 10C can be fabricated.

Figure 12A:
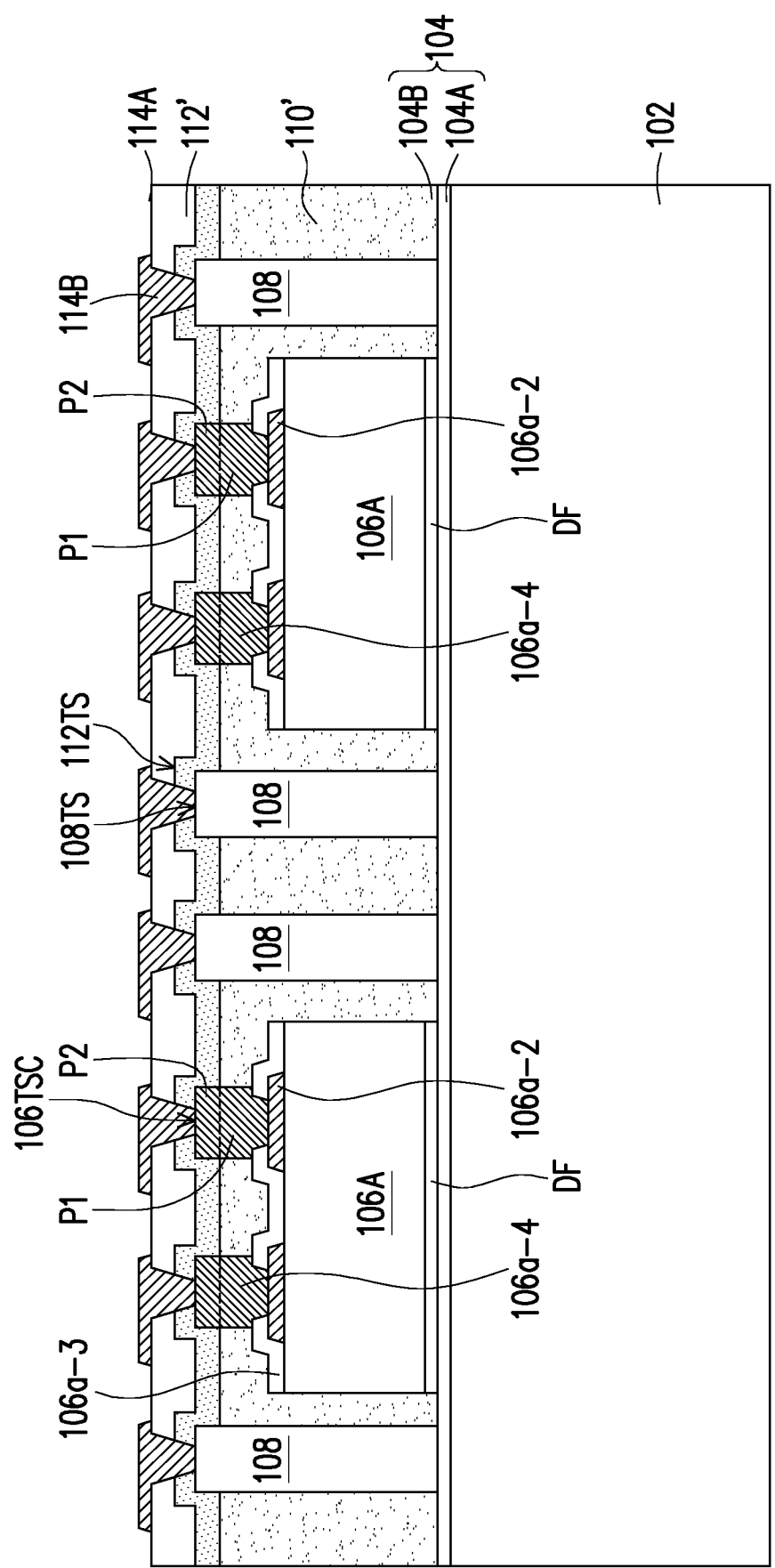
FIG. 12A and FIG. 12B are schematic sectional views of various stages in a method of fabricating a package structure according to some other exemplary embodiments of the present disclosure.
Figure 12B:
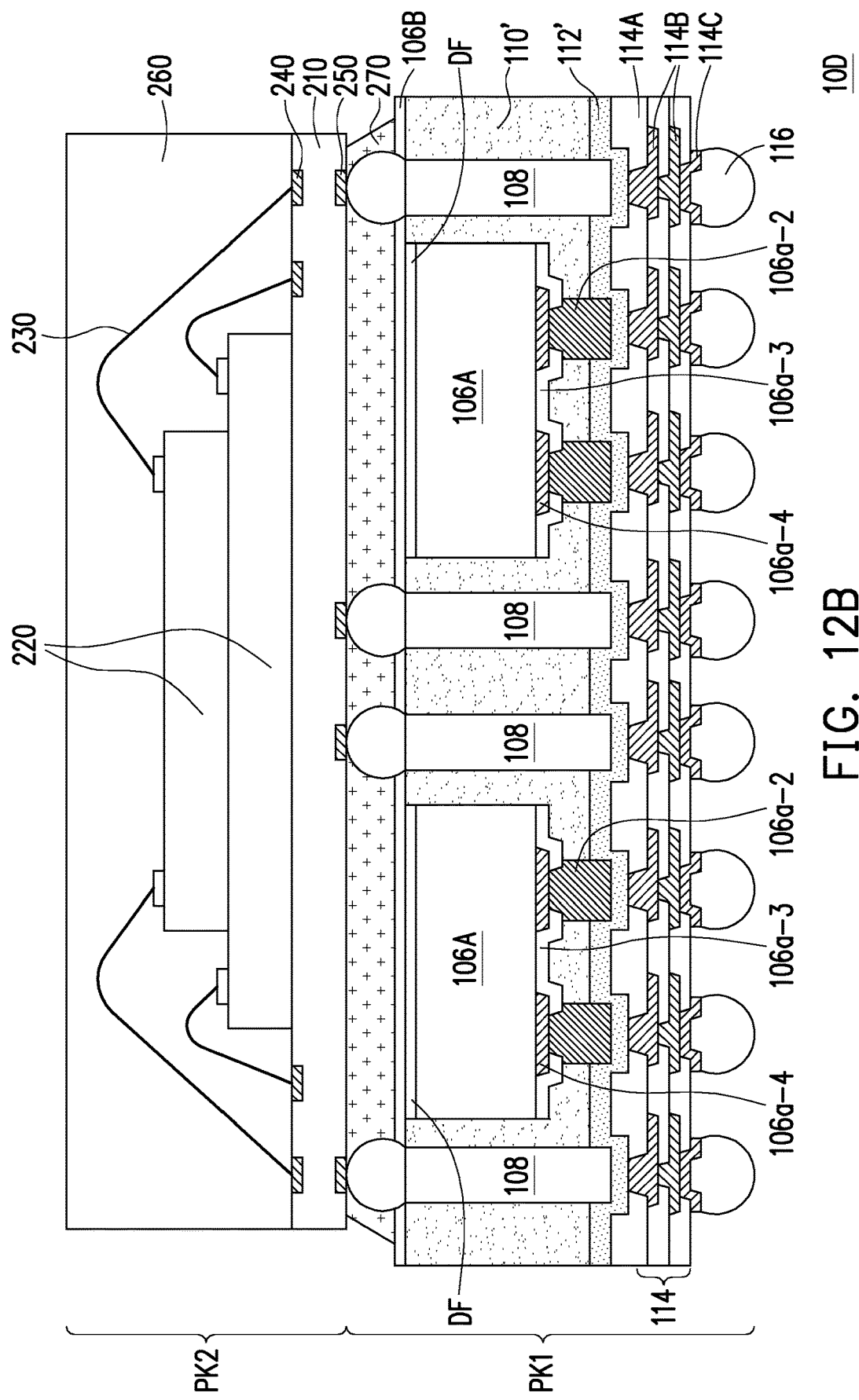

FIG. 12A and FIG. 12B are schematic sectional views of various stages in a method of fabricating a package structure according to some other exemplary embodiments of the present disclosure. The embodiment shown in FIG. 12A and FIG. 12B is similar to the embodiment shown in FIG. 11A to FIG. 11C, hence the same reference numerals are used to refer to the same or liked parts, and its detailed description will be omitted herein. The difference between the embodiments of FIGS. 12A-12B and FIGS. 11A-11C is in the design of the isolation layer 112'. As illustrated in FIG. 12A, the isolation layer 112' is formed to surround and be in contact with the second portion P2 of the conductive posts 106*a*-4. Furthermore, in some embodiments, a top surface 106TSC of the conductive posts 106*a*-4 is lower than a top surface 112TS of the isolation layer 112'. In other words, a planarization step is not performed to the isolation layer 112', and the isolation layer 112' is conformally located on the top surface 108TS of the through insulator vias 108, located on the top surface 106TSC of the conductive posts 106*a*-4, and over the insulating encapsulant 110'. In a subsequent step, a first dielectric layer 114A of the redistribution layer 114 is formed over the isolation layer 112'. The first dielectric layer 114A and the isolation layer 112' are patterned to form openings that reveal the top surface 108TS of the through insulator vias 108 and the top surface 106TSC of the conductive posts 106*a*-4. The metallization layers 114B are then formed within the openings to be electrically connected to the first semiconductor dies 106A and the through insulator vias 108.

Referring to FIG. 12B, in some embodiments, the same steps described in FIG. 7 to FIG. 9 may then be performed to form the redistribution layer 114, the conductive balls 116 and 118 of the package structure PK1. Subsequently, the same package structure PK2 may be stacked over the package structure PK1 and be electrically connected thereto. After stacking the package structure PK2 on the package structure PK1 and providing electrical connection therebetween, a package-on-package structure 10D can be fabricated.

Figure 13A:
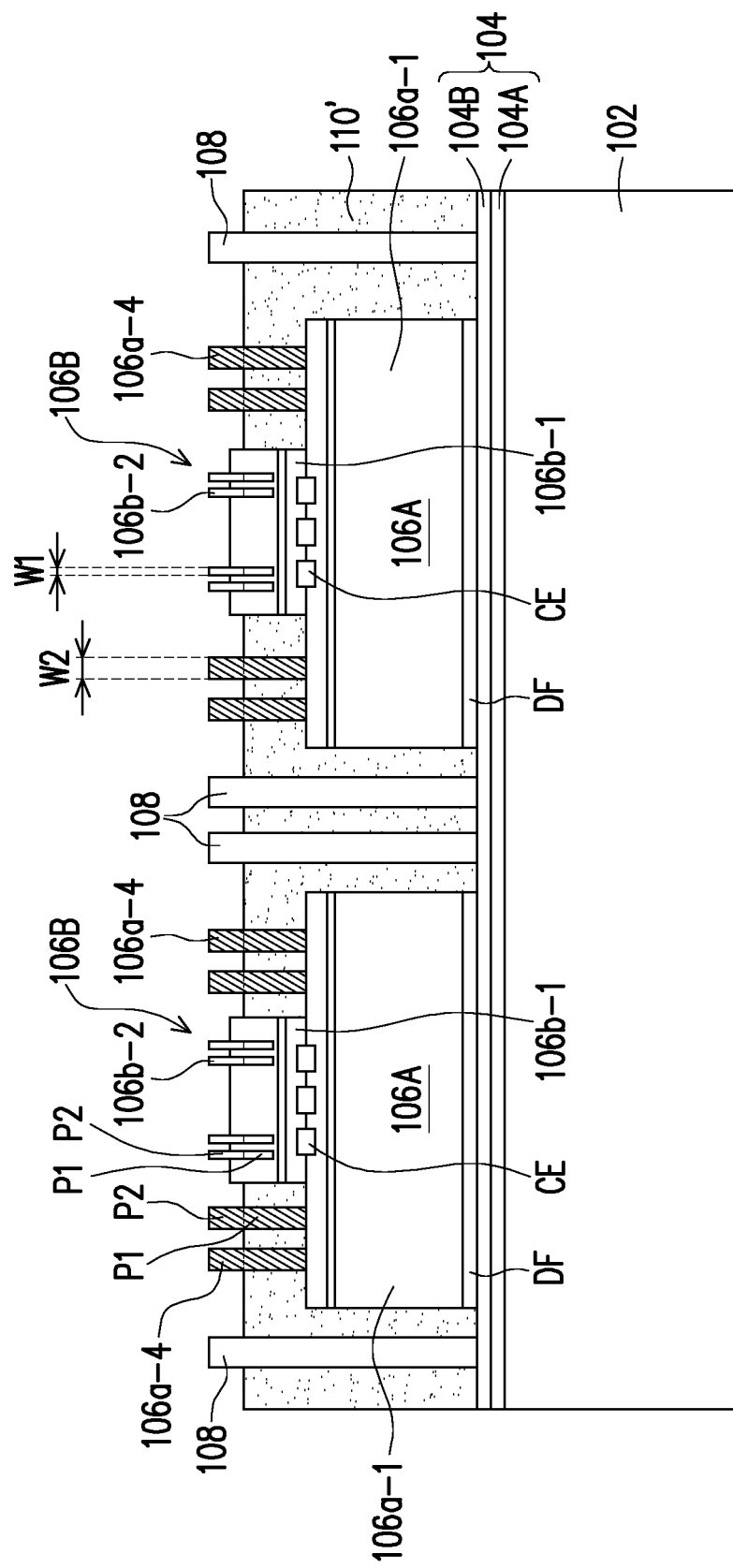
FIG. 13A to FIG. 13C are schematic sectional views of various stages in a method of fabricating a package structure according to some other exemplary embodiments of the present disclosure.
Figure 13B:
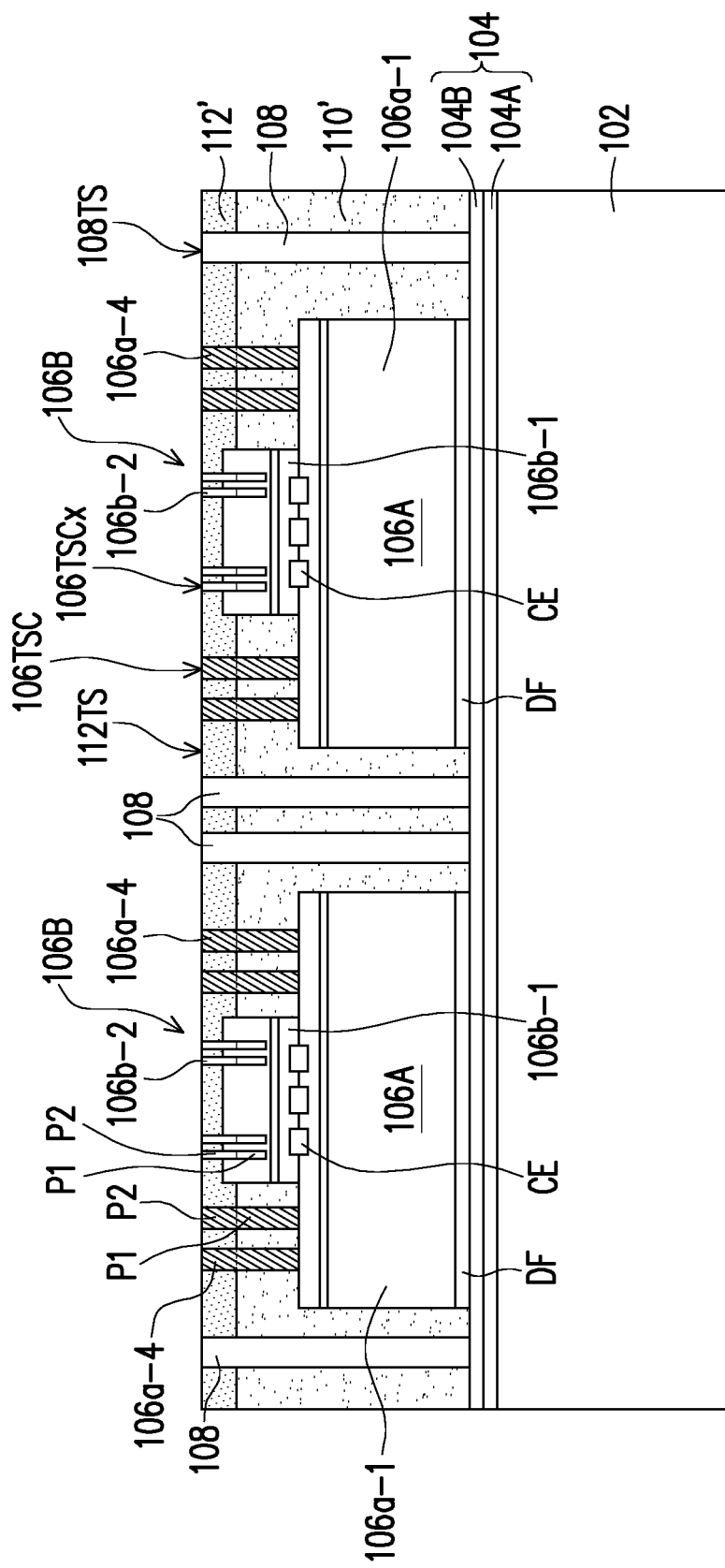
Figure 13C:
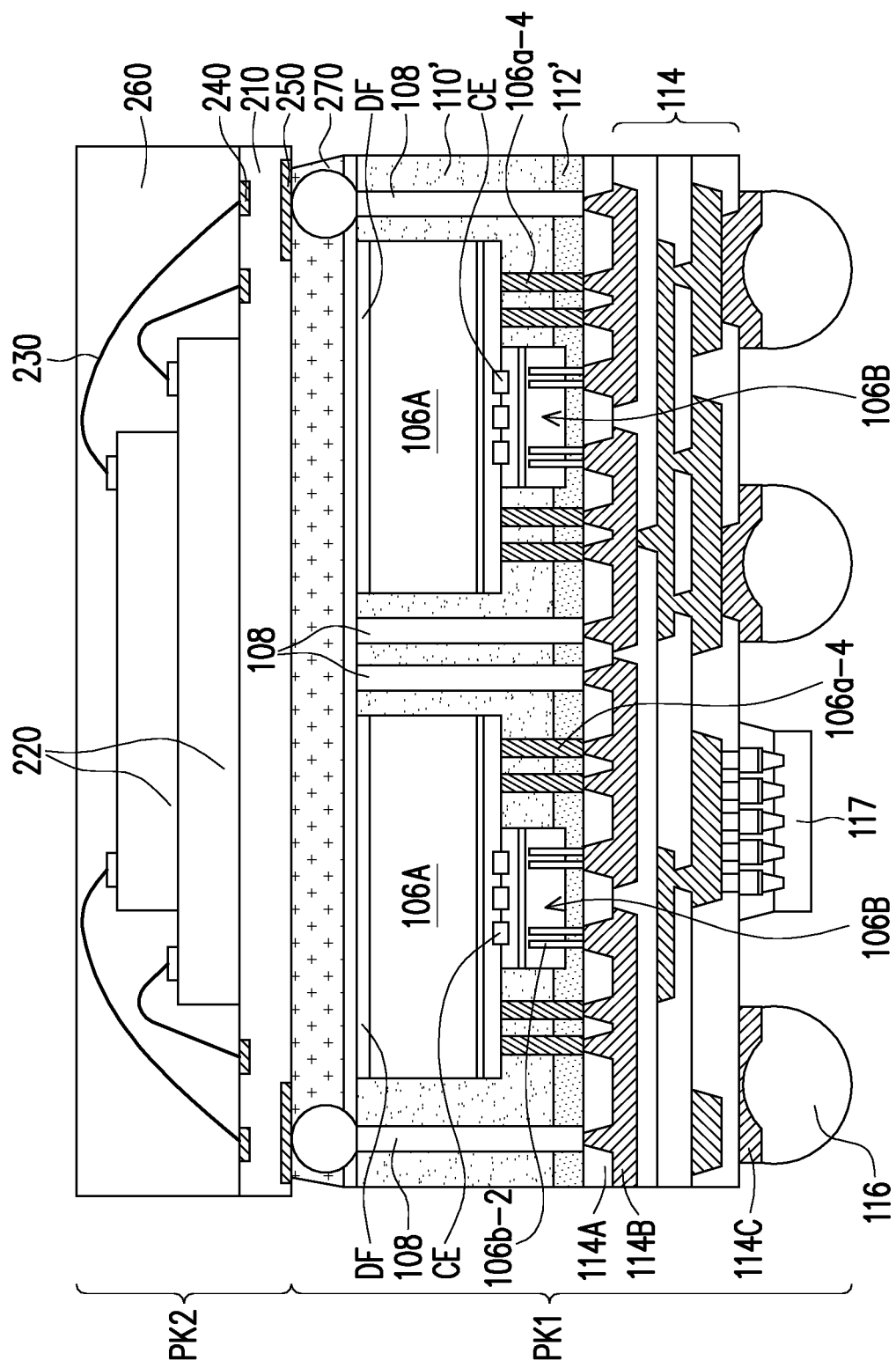

FIG. 13A to FIG. 13C are schematic sectional views of various stages in a method of fabricating a package structure according to some other exemplary embodiments of the present disclosure. The embodiment shown in FIG. 13A to FIG. 13C is similar to the embodiment shown in FIG. 1 to FIG. 9, hence the same reference numerals are used to refer to the same or liked parts, and its detailed description will be omitted herein. The difference between the embodiments of FIGS. 13A-13C and FIGS. 1-9 is that second semiconductor dies 106B are further provided.

As illustrated in FIG. 13A, the second semiconductor die 106B is stacked on the first semiconductor die 106A to form stacked dies. In some embodiments, the second semiconductor die 106B is connected to the first semiconductor die 106A through connecting elements CE. In certain embodiments, the connecting elements CE may be conductive bumps or conductive pads that provide the necessary connections between the first semiconductor die 106A and the second semiconductor die 106B, the disclosure is not limited thereto. In the exemplary embodiment, the first semiconductor die 106A do not have a protection layer 106a-5, and the second semiconductor die 106B is located on the semiconductor substrate 106a-1 of the first semiconductor die 106A in between two conductive posts 106a-4. In some embodiments, the second semiconductor die 106B comprises a second semiconductor substrate 106b-1 and a plurality of second conductive posts 106b-2 disposed on the second semiconductor substrate 106b-1. In some embodiments, the conductive posts 106a-4 of the first semiconductor die 106A and the second conductive posts 106b-2 of the second semiconductor die 106B respectively have a first portion P1 that is surrounded by the insulating encapsulant 110' and a second portion P2 that protrudes out from the insulting encapsulant 110'. In some embodiments, a width W1 of the second conductive posts 106b-2 is smaller than a width W2 of the conductive posts 106a-4. In other words, the dimensions of the conductive posts 106a-4 and the second conductive posts 106b-2 are different. In one exemplary embodiment, the width W1 of the second conductive posts 106b-2 is in a range of 1 μm to 10 μm, whereas the width W2 of the conductive posts 106a-4 is in a range of 10 μm to 90 μm. The disclosure is not limited thereto.

Referring to FIG. 13B, in a next step, an isolation material (not shown) may be formed over the insulating encapsulant 110', and a planarization step may be performed to form the isolation layer 112'. In the exemplary embodiment, after the planarization step, the top surface 112TS of the isolation layer 112', the top surface 108TS of the through insulator vias 108, the top surface 106TSC of the conductive posts 106a-4 and the top surface 106TSCx of the second conductive posts 106b-2 are coplanar and leveled with one another. In some embodiments, the isolation layer 112' is formed to surround and be in contact with the conductive posts 106a-4 of the first semiconductor die 106A, and formed to surround and be in contact with the second conductive posts 106b-2 of the second semiconductor die 106B. Referring to FIG. 13C, after forming the isolation layer 112', the same steps described in FIG. 7 to FIG. 9 may then be performed to form the redistribution layer 114, the conductive balls 116 and 118 of the package structure PK1. In some embodiments, an integrated passive device 117 may be further disposed on the redistribution layer 114. Subsequently, the same package structure PK2 may be stacked over the package structure PK1 and be electrically connected thereto. After stacking the package structure PK2 on the package structure PK1 and providing electrical connection therebetween, a package-on-package structure 10E can be fabricated.

In the above-mentioned embodiments, the insulating encapsulant is formed to directly encapsulate the semiconductor dies without further grinding or planarization steps. Furthermore, an isolation layer is formed in between the insulating encapsulant and the redistribution layer. Therefore, the generation of molding pits due to the presence of fillers in the insulating encapsulant after the grinding or planarization steps may be reduced. Furthermore, the isolation layer will serve as a barrier to isolate the molding pits in the insulating encapsulant away from the redistribution layer. As such, when forming a redistribution layer (RDL) over the insulating encapsulant, an RDL collapse issue or abnormal RDL patterns may be prevented. Overall, the formation of the isolation layer on the insulating encapsulant will provide a more planar surface allowing for efficient fabrication of the redistribution layer, improving the yield of the RDL pattern.

In accordance with some embodiments of the present disclosure, a package structure including at least one semiconductor die, an insulating encapsulant, an isolation layer and a redistribution layer is provided. The at least one first semiconductor die has a semiconductor substrate and a conductive post disposed on the semiconductor substrate. The insulating encapsulant is partially encapsulating the first semiconductor die, wherein the conductive post has a first portion surrounded by the insulating encapsulant and a second portion that protrudes out from the insulating encapsulant. The isolation layer is disposed on the insulating encapsulant and surrounding the second portion of the conductive post. The redistribution layer is disposed on the first semiconductor die and the isolation layer, wherein the redistribution layer is electrically connected to the conductive post of the first semiconductor die.

In accordance with some other embodiments of the present disclosure, a package structure including a first semiconductor die, an insulating encapsulant, an isolation layer and a redistribution layer is provided. The first semiconductor die has a semiconductor substrate and a plurality of conductive posts disposed on the semiconductor substrate. The insulating encapsulant is partially encapsulating the first semiconductor die, wherein a top surface of the insulating encapsulant is lower than a level of a top surface of the plurality of conductive posts. The isolation layer is disposed on the top surface of the insulating encapsulant and surrounding the plurality of conductive posts, wherein a top surface of the isolation layer is substantially coplanar with the top surface of the plurality of conductive posts, and a ratio of a thickness of the isolation layer to a thickness of the insulating encapsulant is in a range of 1:6 to 1:40. The redistribution layer is disposed on the first semiconductor die and the isolation layer, wherein the redistribution layer is electrically connected to the plurality of conductive posts of the first semiconductor die.

In accordance with yet another embodiment of the present disclosure, a method of fabricating a package structure is described. The method includes the following steps. A first semiconductor die is bonded on a carrier, wherein the first semiconductor die comprises a semiconductor substrate and a plurality of conductive posts disposed on the semiconductor substrate. An insulating encapsulant is formed to partially encapsulate the first semiconductor die, wherein the insulating encapsulant is formed to surround a first portion of the plurality of conductive posts, and a second portion of the plurality of conductive posts protrudes out from the insulating encapsulant. An isolation layer is formed on the insulating encapsulant to surround the second portion of the plurality of conductive posts. A redistribution layer is formed on the first semiconductor die and the isolation layer, wherein the redistribution layer is electrically connected to the first semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a semiconductor die;
   an insulating encapsulant encapsulating a portion of the semiconductor die and revealing another portion of the semiconductor die;
   an isolation layer disposed on the insulating encapsulant and surrounding the another portion of the semiconductor die;
   a plurality of through insulator vias surrounding the semiconductor die, wherein the plurality of through insulator vias protrude out from the insulating encapsulant, and the isolation layer surrounds the protruded portion of the plurality of through insulator vias; and
   a redistribution layer disposed on the isolation layer, wherein the redistribution layer is separated from the insulating encapsulant by the isolation layer, and the redistribution layer is electrically connected to the semiconductor die.

2. The structure according to claim 1, wherein the semiconductor die comprises a semiconductor substrate and at least one conductive post disposed on the semiconductor substrate, and the at least one conductive post has a first portion surrounded by the insulating encapsulant and a second portion surrounded by the isolation layer.

3. The structure according to claim 2, wherein the semiconductor die further comprises a protection layer disposed on the semiconductor substrate and surrounding the at least one conductive post, the isolation layer surrounds the protection layer, and a top surface of the protection layer is coplanar with a top surface of the isolation layer.

4. The structure according to claim 2, wherein the semiconductor die further comprises a protection layer disposed on the semiconductor substrate and surrounding the at least one conductive post, the isolation layer surrounds the protection layer, and a top surface of the protection layer is lower than a top surface of the isolation layer.

5. The structure according to claim 2, wherein the isolation layer surrounds and is in contact with the at least one conductive post, and a top surface of the isolation layer is coplanar with a top surface of the at least one conductive post.

6. The structure according to claim 2, wherein the isolation layer partially covers and is in contact with a top surface of the at least one conductive post.

7. The structure according to claim 1, further comprising a second semiconductor die stacked on the first semiconductor die, wherein the insulating encapsulant is encapsulating a portion of the second semiconductor die and revealing another portion of the second semiconductor die.

8. A structure, comprising:
   an insulating encapsulant;
   an isolation layer disposed on and in contact with the insulating encapsulant, wherein a ratio of a thickness of the isolation layer to a thickness of the insulating encapsulant is in a range of 1:6 to 1:40;
   a first semiconductor die embedded within the insulating encapsulant and surrounded by the isolation layer, wherein a top surface of the semiconductor die is higher than a level of a top surface of the insulating encapsulant;
   a plurality of through insulator vias surrounding the first semiconductor die, wherein the plurality of through insulator vias protrude out from the insulating encapsulant, and the isolation layer surrounds the protruded portion of the plurality of through insulator vias; and
   a redistribution layer disposed on the isolation layer, wherein the redistribution layer comprises dielectric layers and metallization layers alternately stacked over the isolation layer, wherein the redistribution layer is separated from the insulating encapsulant by the isolation layer, and the metallization layers of the redistribution layer are electrically connected to the first semiconductor die.

9. The structure according to claim 8, wherein the first semiconductor die comprises a semiconductor substrate and a plurality of conductive posts disposed on the semiconductor substrate, and the plurality of conductive posts protrudes out from the insulating encapsulant.

10. The structure according to claim 9, wherein the isolation layer is conformally disposed on the insulating encapsulant and over the plurality of conductive posts.

11. The structure according to claim 9, wherein a top surface of the isolation layer is coplanar with a top surface of the plurality of conductive posts.

12. The structure according to claim 9, further comprising a second semiconductor die stacked on the first semiconductor die, and the second semiconductor die is surrounded by the plurality of conductive posts, and is embedded within the insulating encapsulant and surrounded by the isolation layer.

13. The structure according to claim 12, wherein the second semiconductor die comprises a second semiconductor substrate and a plurality of second conductive posts disposed on the second semiconductor substrate, wherein a top surface of the plurality of second conductive posts is coplanar with a top surface of the plurality of conductive posts.

14. A package-on-package structure, comprising:
   a first package, comprising:
      an insulating encapsulant having a first surface and a second surface opposite to the first surface;
      a first semiconductor die having at least one conductive post, wherein the first semiconductor die is encapsulated by the insulating encapsulant and a portion of the at least one conductive post protrudes out from the second surface of the insulating encapsulant;
      a redistribution layer disposed on the first semiconductor die and separated from the insulating encapsulant, wherein the redistribution layer is electrically connected to the first semiconductor die; and
      an isolation layer disposed on the insulating encapsulant and partially surrounding the first semiconductor die;

a plurality of through insulator vias surrounding the first semiconductor die, wherein the plurality of through insulator vias protrude out from the insulating encapsulant, and the isolation layer surrounds the protruded portion of the plurality of through insulator vias; and a second package stacked on the first package over the first surface of the insulating encapsulant.

15. The package-on-package structure according to claim 14, wherein the first package further comprises a plurality of conductive balls over the first surface of the insulating encapsulant, wherein the second package is electrically connected to the first package through the plurality of conductive balls.

16. The package-on-package structure according to claim 14, wherein the first package further comprises a second semiconductor die stacked on the first semiconductor die and having at least one second conductive post, the second semiconductor die is encapsulated by the insulating encapsulant and a portion of the at least one second conductive post protrudes out from the second surface of the insulating encapsulant.

17. The package-on-package structure according to claim 16, wherein the second semiconductor die is bonded to the first semiconductor die through a plurality of connecting elements.

18. The package-on-package structure according to claim 14, wherein the second package comprises:

a substrate having pads located on two opposing surfaces of the substrate, wherein the first package is electrically connected to the pads of the substrate;

a plurality of semiconductor chips disposed on the substrate and electrically connected to the pads of the substrate.

19. The structure according to claim 1, further comprising conductive balls and an integrated passive device disposed on and electrically connected to the redistribution layer.

20. The structure according to claim 1, further comprising conductive balls disposed on and electrically connected to the plurality of through insulator vias, and a package structure disposed on and electrically connected to the conductive balls.

* * * * *